(12) United States Patent
Okuda

(10) Patent No.: US 11,635,559 B2
(45) Date of Patent: Apr. 25, 2023

(54) OPTICAL FILM, CIRCULARLY POLARIZING PLATE, AND DISPLAY DEVICE

(71) Applicant: FUJIFILM Corporation, Tokyo (JP)

(72) Inventor: Shuhei Okuda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/889,932

(22) Filed: Aug. 17, 2022

(65) Prior Publication Data

US 2023/0093491 A1    Mar. 23, 2023

(30) Foreign Application Priority Data

Aug. 19, 2021 (JP) .............................. JP2021-134192
Feb. 25, 2022 (JP) .............................. JP2022-028077

(51) Int. Cl.
| C09K 19/58 | (2006.01) |
| C09K 19/20 | (2006.01) |
| G02B 5/30  | (2006.01) |
| H01L 51/52 | (2006.01) |

(52) U.S. Cl.
CPC ........ *G02B 5/3016* (2013.01); *C09K 19/2007* (2013.01); *C09K 19/588* (2013.01); *H01L 51/5281* (2013.01)

(58) Field of Classification Search
CPC ...... C09K 19/38; C09K 19/42; C09K 19/586; G02B 5/3016; H01L 51/5281
See application file for complete search history.

(56) References Cited

U.S. PATENT DOCUMENTS

| 9,128,322 B2 | 9/2015 | Saitoh et al. |
| 2009/0128718 A1* | 5/2009 | Nakagawa .......... G02F 1/13363 349/8 |
| 2014/0284583 A1 | 9/2014 | Saitoh et al. |

(Continued)

FOREIGN PATENT DOCUMENTS

| JP | 5960743 B2 | 8/2016 | |
| JP | 7182627 B2 * | 12/2022 | ............. C09K 19/02 |
| WO | WO-2021033640 A1 * | 2/2021 | ......... C09K 19/2007 |

OTHER PUBLICATIONS

Kodama et al., WO2021033640A1, Feb. 2021, machine translation (Year: 2021).*
JP-7182627-B2 Machine Translation (Year: 2022).*

*Primary Examiner* — Tracie Y Green
(74) *Attorney, Agent, or Firm* — Edwards Neils LLC; Jean C. Edwards, Esq.

(57) ABSTRACT

An optical film suppresses at any azimuthal angle where the optical film is combined with a polarizer and applied as a circularly polarizing plate to a display device; a circularly polarizing plate; and a display device. The optical film includes a first, a second, and a third optically anisotropic layer in this order, in which the first layer is formed by fixing a vertically aligned disk-like liquid crystal compound or formed by fixing a horizontally aligned rod-like liquid crystal compound, the second layer is formed by fixing a rod-like liquid crystal compound twist-aligned along a helical axis extending in a thickness direction, the third layer is formed by fixing a vertically aligned rod-like liquid crystal compound, and at least one of the first, second, or third layers is formed of a liquid crystal compound containing a reverse wavelength dispersion liquid crystal compound.

11 Claims, 5 Drawing Sheets

(56) References Cited

U.S. PATENT DOCUMENTS

| | | | |
|---|---|---|---|
| 2015/0079380 A1* | 3/2015 | Muramatsu | G02B 5/3083 |
| | | | 252/299.61 |
| 2019/0113667 A1* | 4/2019 | Ito | G02F 1/1335 |
| 2020/0109333 A1* | 4/2020 | Akutagawa | G02B 5/30 |
| 2022/0204855 A1* | 6/2022 | Kodama | H05B 33/02 |

* cited by examiner

OPTICAL FILM, CIRCULARLY POLARIZING PLATE, AND DISPLAY DEVICE

CROSS-REFERENCE TO RELATED APPLICATIONS

The present application claims priority under 35 U.S.C. § 119 to Japanese Patent Application No. 2021-134192, filed on Aug. 19, 2021 and Japanese Patent Application No. 2022-028077, filed on Feb. 25, 2022. Each of the above applications is hereby expressly incorporated by reference, in its entirety, into the present application.

BACKGROUND OF THE INVENTION

1. Field of the Invention

The present invention relates to an optical film, a circularly polarizing plate, and a display device.

2. Description of the Related Art

An optically anisotropic layer having refractive index anisotropy is applied to various applications such as an antireflection film of a display device and an optical compensation film of a liquid crystal display device.

For example, JP5960743B discloses a phase difference plate in which two types of optically anisotropic layers exhibiting predetermined optical properties are laminated.

SUMMARY OF THE INVENTION

The present inventors have found that, in a case where an optical film described in JP5960743B on which an optically anisotropic layer is laminated is combined with a polarizer and then applied as a circularly polarizing plate to a display device, the display device is displayed in black, and the display device is observed from an oblique direction at all azimuthal angles, there is a shift in tint from black depending on the azimuthal angle and therefore there is room for improvement.

The present invention has been made in view of the above-mentioned circumstances, and an object of the present invention is to provide an optical film in which a shift in tint of black is suppressed at any azimuthal angle in a case where the optical film is combined with a polarizer and then applied as a circularly polarizing plate to a display device, and the display device in black display is observed from an oblique direction at all azimuthal angles.

Another object of the present invention is to provide a circularly polarizing plate and a display device.

As a result of extensive studies on the problems of the related art, the present inventors have found that the foregoing objects can be achieved by the following configurations.

(1) An optical film including a first optically anisotropic layer, a second optically anisotropic layer, and a third optically anisotropic layer in this order, in which the first optically anisotropic layer is a layer formed by fixing a vertically aligned disk-like liquid crystal compound or a layer formed by fixing a horizontally aligned rod-like liquid crystal compound, the second optically anisotropic layer is a layer formed by fixing a rod-like liquid crystal compound twist-aligned along a helical axis extending in a thickness direction, the third optically anisotropic layer is a layer formed by fixing a vertically aligned rod-like liquid crystal compound, and at least one of the first optically anisotropic layer, the second optically anisotropic layer, or the third optically anisotropic layer is a layer formed of a liquid crystal compound containing a reverse wavelength dispersion liquid crystal compound.

(2) The optical film according to (1), in which a ratio of a refractive index anisotropy $\Delta n$ of the second optically anisotropic layer at a wavelength of 450 nm to a refractive index anisotropy $\Delta n$ of the second optically anisotropic layer at a wavelength of 550 nm is 1.02 to 1.09.

(3) The optical film according to (1) or (2), in which the first optically anisotropic layer is the layer formed by fixing a vertically aligned disk-like liquid crystal compound, and a ratio of an in-plane retardation of the first optically anisotropic layer at a wavelength of 450 nm to an in-plane retardation of the first optically anisotropic layer at a wavelength of 550 nm is 1.08 to 1.25.

(4) The optical film according to any one of (1) to (3), in which a ratio of a thickness direction retardation of the third optically anisotropic layer at a wavelength of 450 nm to a thickness direction retardation of the third optically anisotropic layer at a wavelength of 550 nm is 0.82 to 1.12.

(5) The optical film according to (4), in which a total thickness of the optically anisotropic layers contained in the optical film is 10 μm.

(6) A circularly polarizing plate including the optical film according to any one of (1) to (5) and a polarizer, in which the first optically anisotropic layer is disposed closer to the polarizer than the second optically anisotropic layer and the third optically anisotropic layer.

(7) The circularly polarizing plate according to (6), in which a luminosity corrected single transmittance of the polarizer is 42% or more.

(8) A display device including the optical film according to any one of (1) to (5) or the circularly polarizing plate according to (6) or (7).

According to the present invention, it is possible to provide an optical film in which a shift in tint of black is suppressed at any azimuthal angle in a case where the optical film is combined with a polarizer and then applied as a circularly polarizing plate to a display device, and the display device in black display is observed from an oblique direction at all azimuthal angles.

According to another aspect of the present invention, it is possible to provide a circularly polarizing plate and a display device.

DESCRIPTION OF THE PREFERRED EMBODIMENTS

Figure 1:
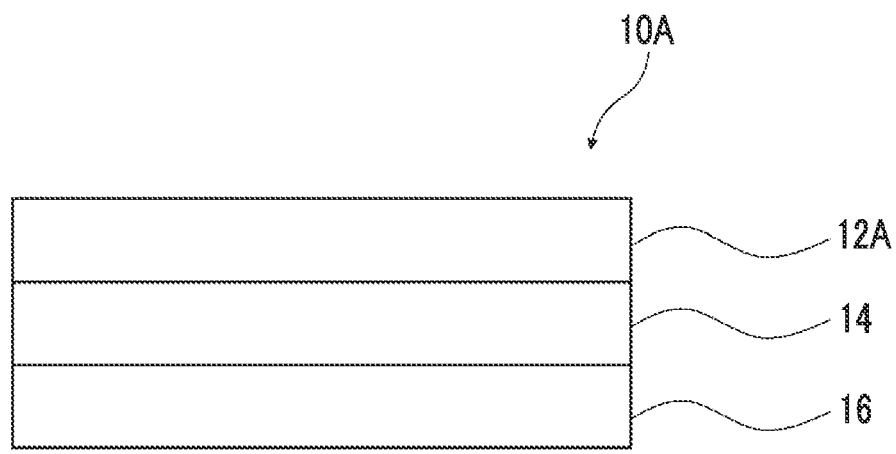
FIG. 1 is an example of a schematic cross-sectional view of a first embodiment of an optical film of the present invention.

Hereinafter, the present invention will be described in more detail.

Any numerical range expressed using "to" in the present specification refers to a range including the numerical values before and after the "to" as a lower limit value and an upper limit value, respectively.

In addition, the in-plane slow axis and the in-plane fast axis are defined at a wavelength of 550 nm unless otherwise specified. That is, unless otherwise specified, for example, the in-plane slow axis direction means a direction of the in-plane slow axis at a wavelength of 550 nm.

In the present invention, $Re(\lambda)$ and $Rth(\kappa)$ represent an in-plane retardation and a thickness direction retardation at a wavelength $\lambda$, respectively. Unless otherwise specified, the wavelength $\lambda$ is 550 nm.

In the present invention, $Re(\lambda)$ and $Rth(\lambda)$ are values measured at a wavelength $\lambda$ in AxoScan OPMF-1 (manufactured by Opto Science, Inc.). By inputting an average refractive index $((nx+ny+nz)/3)$ and a film thickness (d (μm)) in AxoScan, slow axis direction (°)

$Re(\lambda=R0(\lambda)$ $Rth(\lambda)=((nx+ny)/2-nz)\times d$ are calculated.

Although $R0(\lambda)$ is displayed as a numerical value calculated by AxoScan OPMF-1, it means $Re(\lambda)$.

In the present specification, the refractive indexes nx, ny, and nz are measured using an Abbe refractometer (NAR-4T, manufactured by Atago Co., Ltd.) and using a sodium lamp ($\lambda$=589 nm) as a light source. In addition, in a case of measuring the wavelength dependence, it can be measured with a multi-wavelength Abbe refractometer DR-M2 (manufactured by Atago Co., Ltd.) in combination with an interference filter.

In addition, the values in Polymer Handbook (John Wiley & Sons, Inc.) and catalogs of various optical films can be used. The values of the average refractive index of main optical films are illustrated below: cellulose acylate (1.48), cycloolefin polymer (1.52), polycarbonate (1.59), polymethylmethacrylate (1.49), and polystyrene (1.59).

The bonding direction of the divalent group (for example, —O—CO—) described in the present specification is not particularly limited. For example, in a case where L in the group represented by X-L-Y is —O—CO— and then in a case where the position bonded to the X side is defined as *1 and the position bonded to the Y side is defined as *2, L may be *1-O—CO—*2 or * 1-CO—O-*2.

In the present specification, the "visible ray" is intended to refer to light having a wavelength of 400 to 700 nm. In addition, the "ultraviolet ray" is intended to refer to light having a wavelength of 10 nm or more and less than 400 nm.

In addition, in the present specification, the "orthogonal" or "parallel" is intended to include a range of errors acceptable in the art to which the present invention pertains. For example, it means that an angle is within an error range off 5° with respect to the exact angle, and the error with respect to the exact angle is preferably within a range of ±3°.

A feature point of the optical film according to the embodiment of the present invention is that predetermined optically anisotropic layers are used in combination.

First Embodiment of Optical Film

Hereinafter, the first embodiment of the optical film according to the embodiment of the present invention will be described with reference to the accompanying drawings. FIG. 1 shows a schematic cross-sectional view of a first embodiment of the optical film according to the embodiment of the present invention.

An optical film 10A has a first optically anisotropic layer 12A, a second optically anisotropic layer 14, and a third optically anisotropic layer 16 in this order.

The first optically anisotropic layer 12A is a layer formed by fixing a vertically aligned disk-like liquid crystal compound, the second optically anisotropic layer 14 is a layer formed by fixing a rod-like liquid crystal compound twist-aligned along a helical axis extending in a thickness direction, and the third optically anisotropic layer 16 is a layer formed by fixing a vertically aligned rod-like liquid crystal compound.

The angle formed by the in-plane slow axis of the first optically anisotropic layer 12A and the in-plane slow axis on the surface of the second optically anisotropic layer 14 on the first optically anisotropic layer 12A side is preferably in a range of 0° to 20°, as will be described later.

In addition, as will be described later, in the first embodiment, at least one of the first optically anisotropic layer 12A, the second optically anisotropic layer 14, or the third optically anisotropic layer 16 is a layer formed of a liquid crystal compound containing a reverse wavelength dispersion liquid crystal compound.

Hereinafter, each layer will be described in detail.

First Optically Anisotropic Layer 12A

The first optically anisotropic layer 12A is a layer formed by fixing a vertically aligned disk-like liquid crystal compound.

In the present specification, the "fixed" state is a state in which the alignment of the liquid crystal compound is maintained. Specifically, the "fixed" state is preferably a state in which, in a temperature range of usually 0° C. to 50° C. or in a temperature range of −30° C. to 70° C. under more severe conditions, the layer has no fluidity and a fixed alignment morphology can be maintained stably without causing a change in the alignment morphology due to an external field or an external force.

The first optically anisotropic layer 12A is a layer formed by fixing a vertically aligned disk-like liquid crystal compound.

The layer formed by fixing a vertically aligned disk-like liquid crystal compound is more specifically a layer formed by fixing a disk-like liquid crystal compound that is vertically aligned and whose optical axis (an axis orthogonal to a disc plane) is arranged in the same direction.

The state in which a disk-like liquid crystal compound is vertically aligned means that the disc plane of the disk-like liquid crystal compound and the thickness direction of the layer are parallel to each other. It is not required to be strictly parallel, and the angle formed by the disc plane and the thickness direction of the layer is preferably in a range of 0° to 20° and more preferably in a range of 0° to 10°.

In addition, the state in which the optical axis (axis orthogonal to the disc plane) of the disk-like liquid crystal compound is arranged in the same direction does not require that the optical axis of the disk-like liquid crystal compound is arranged strictly in the same direction, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

The in-plane retardation of the first optically anisotropic layer 12A at a wavelength of 550 nm is not particularly limited, and is preferably 120 to 240 nm and more preferably 130 to 230 nm from the viewpoint that a shift in tint of black is further suppressed at any azimuthal angle (hereinafter, also simply referred to as "the effect of the present invention is more excellent") in a case where the optical film according to the embodiment of the present invention is combined with a polarizer and then applied as a circularly polarizing plate to a display device, and the display device in black display is observed from an oblique direction at all azimuthal angles.

The thickness direction retardation of the first optically anisotropic layer 12A at a wavelength of 550 nm is not particularly limited, and is preferably −120 to −60 nm and more preferably −115 to −65 nm from the viewpoint that the effect of the present invention is more excellent.

A known compound can be used as the disk-like liquid crystal compound.

Examples of the disk-like liquid crystal compound include the compounds described in paragraphs [0020] to [0067] of JP2007-108732A and paragraphs [0013] to [0108] of JP2010-244038A.

The disk-like liquid crystal compound may have a polymerizable group.

In the present specification, the type of the polymerizable group is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The first optically anisotropic layer 12A is preferably a layer formed by fixing a disk-like liquid crystal compound vertically aligned and having a polymerizable group by polymerization.

The first optically anisotropic layer 12A may exhibit forward wavelength dispersibility (a characteristic that the in-plane retardation decreases as the measurement wavelength increases) or reverse wavelength dispersibility (a characteristic that the in-plane retardation increases as the measurement wavelength increases). The forward wavelength dispersibility and the reverse wavelength dispersibility are preferably exhibited in a visible light region.

The ratio (Re(450)/Re(550)) of the in-plane retardation of the first optically anisotropic layer 12A at a wavelength of 450 nm to the in-plane retardation of the first optically anisotropic layer 12A at a wavelength of 550 nm is preferably 0.80 to 1.25 and more preferably 1.08 to 1.25.

The ratio (Re(650)/Re(550)) of the in-plane retardation of the first optically anisotropic layer 12A at a wavelength of 650 nm to the in-plane retardation of the first optically anisotropic layer 12A at a wavelength of 550 nm is preferably 0.90 to 1.20 and more preferably 0.92 to 1.00.

The average thickness of the first optically anisotropic layer 12A is not particularly limited, and is preferably 10 m or less, more preferably 0.1 to 5.0 µm, and still more preferably 0.3 to 2.0 µm.

The average thickness is obtained by measuring the thicknesses of any five or more points of the first optically anisotropic layer 12A and arithmetically averaging the measured values.

Second Optically Anisotropic Layer 14

The second optically anisotropic layer 14 is a layer formed by fixing a rod-like liquid crystal compound twist-aligned along a helical axis extending in a thickness direction.

The second optically anisotropic layer 14 is preferably a layer formed by fixing a so-called chiral nematic phase having a helical structure. In a case of forming the second optically anisotropic layer 14, it is preferable to use at least a rod-like liquid crystal compound and a chiral agent which will be described later.

The twisted angle of the rod-like liquid crystal compound (twisted angle of the liquid crystal compound in an alignment direction) is not particularly limited, and is often more than 0° and 360° or less. From the viewpoint that the effect of the present invention is more excellent, the twisted angle of the rod-like liquid crystal compound is preferably within a range of 80°+30° (within a range of 50° to 110°) and more preferably within a range of 80° f 20° (within a range of 60° to 100°).

The twisted angle is measured using an AxoScan (polarimeter) device manufactured by Axometrics, Inc. and using device analysis software of Axometrics, Inc.

In addition, the phrase "the rod-like liquid crystal compound is twist-aligned" is intended to mean that the rod-like liquid crystal compound from one main surface to the other main surface of the second optically anisotropic layer 14 is twisted about the thickness direction of the second optically anisotropic layer 14. Along with this, the alignment direction (in-plane slow axis direction) of the rod-like liquid crystal compound differs depending on the position of the second optically anisotropic layer 14 in a thickness direction.

In the twisted alignment, the major axis of the rod-like liquid crystal compound is arranged so as to be parallel to the main surface of the second optically anisotropic layer 14. It is not required to be strictly parallel, and the angle formed by the major axis of the rod-like liquid crystal compound and the main surface of the second optically anisotropic layer 14 is preferably in a range of 0° to 20° and more preferably in a range of 0° to 10°.

The value of a product Δnd of a refractive index anisotropy Δn of the second optically anisotropic layer 14 at a wavelength of 550 nm and a thickness d of the second optically anisotropic layer 14 is not particularly limited, and is preferably 120 to 240 nm and more preferably 130 to 230 nm from the viewpoint that the effect of the present invention is more excellent.

The Δnd is measured using an AxoScan (polarimeter) device manufactured by Axometrics, Inc. and using device analysis software of Axometrics, Inc.

The angle formed by the in-plane slow axis of the first optically anisotropic layer 12A and the in-plane slow axis on the surface of the second optically anisotropic layer 14 on the first optically anisotropic layer 12A side is preferably in a range of 0° to 20°.

The type of the rod-like liquid crystal compound used for forming the second optically anisotropic layer 14 is not particularly limited, and examples thereof include known compounds.

Examples of the rod-like liquid crystal compound include compounds described in claim 1 of JP1999-513019A (JP-H11-513019A) and paragraphs [0026] to [0098] of JP2005-289980A.

The rod-like liquid crystal compound may have a polymerizable group.

The types of polymerizable groups that the rod-like liquid crystal compound may have are as described above.

The second optically anisotropic layer 14 is preferably a layer formed by fixing a rod-like liquid crystal compound having a polymerizable group by polymerization. More specifically, the second optically anisotropic layer 14 is more preferably a layer formed by fixing a rod-like liquid crystal compound twist-aligned and having a polymerizable group by polymerization.

The ratio of the refractive index anisotropy Δn of the second optically anisotropic layer 14 at a wavelength of 450 nm to the refractive index anisotropy Δn of the second optically anisotropic layer 14 at a wavelength of 550 nm is not particularly limited, and is preferably 0.68 to 1.20, more preferably 1.02 to 1.09, and still more preferably 1.04 to 1.07 from the viewpoint that the effect of the present invention is more excellent.

The ratio of the refractive index anisotropy Δn of the second optically anisotropic layer 14 at a wavelength of 650 nm to the refractive index anisotropy Δn of the second optically anisotropic layer 14 at a wavelength of 550 nm is not particularly limited, and is preferably 0.90 to 1.20 and more preferably 0.92 to 1.00 from the viewpoint that the effect of the present invention is more excellent.

The average thickness of the second optically anisotropic layer 14 is not particularly limited, and is preferably 10 μm or less, more preferably 0.1 to 5.0 μm, and still more preferably 0.3 to 2.0 μm.

The average thickness is obtained by measuring the thicknesses of any five or more points of the second optically anisotropic layer 14 and arithmetically averaging the measured values.

Third Optically Anisotropic Layer 16

The third optically anisotropic layer 16 is a layer formed by fixing a vertically aligned rod-like liquid crystal compound.

The state in which the rod-like liquid crystal compound is vertically aligned means that the major axis of the rod-like liquid crystal compound and the thickness direction of the third optically anisotropic layer 16 are parallel to each other. It is not required to be strictly parallel, and the angle formed by the major axis of the rod-like liquid crystal compound and the thickness direction of the third optically anisotropic layer 16 is preferably in a range of 0° to 20° and more preferably in a range of 0° to 10°.

The thickness direction retardation of the third optically anisotropic layer 16 at a wavelength of 550 nm is not particularly limited, and is preferably −120 to −10 nm and more preferably −100 to −30 nm from the viewpoint that the effect of the present invention is more excellent.

A known compound can be used as the rod-like liquid crystal compound.

Examples of the rod-like liquid crystal compound include the rod-like liquid crystal compound exemplified in the second optically anisotropic layer 14.

The rod-like liquid crystal compound may have a polymerizable group.

The types of polymerizable groups that the rod-like liquid crystal compound may have are as described above.

The third optically anisotropic layer 16 is preferably a layer formed by fixing a rod-like liquid crystal compound vertically aligned and having a polymerizable group by polymerization.

The ratio of the thickness direction retardation of the third optically anisotropic layer 16 at a wavelength of 450 nm to the thickness direction retardation of the third optically anisotropic layer 16 at a wavelength of 550 nm is not particularly limited, and is preferably 0.68 to 1.20 and more preferably 0.82 to 1.12 from the viewpoint that the effect of the present invention is more excellent.

The ratio of the thickness direction retardation of the third optically anisotropic layer 16 at a wavelength of 650 nm to the thickness direction retardation of the third optically anisotropic layer 16 at a wavelength of 550 nm is not particularly limited, and is preferably 0.90 to 1.20 and more preferably 0.92 to 1.00 from the viewpoint that the effect of the present invention is more excellent.

The average thickness of the third optically anisotropic layer 16 is not particularly limited, and is preferably 10 μm or less, more preferably 0.1 to 5.0 μm, and still more preferably 0.3 to 2.0 μm.

The average thickness is obtained by measuring the thicknesses of any five or more points of the third optically anisotropic layer 16 and arithmetically averaging the measured values.

In the optical film 10A, at least one of the first optically anisotropic layer 12A, the second optically anisotropic layer 14, or the third optically anisotropic layer 16 is a layer formed of a liquid crystal compound containing a reverse wavelength dispersion liquid crystal compound. As will be described later, the first optically anisotropic layer 12A, the second optically anisotropic layer 14, and the third optically anisotropic layer 16 are preferably formed of a composition for forming an optically anisotropic layer, and at least one of the first optically anisotropic layer 12A, the second optically anisotropic layer 14, or the third optically anisotropic layer 16 is more preferably formed of a composition for forming an optically anisotropic layer containing a reverse wavelength dispersion liquid crystal compound.

In other words, at least one of the disk-like liquid crystal compound used for forming the first optically anisotropic layer 12A, the rod-like liquid crystal compound used for forming the second optically anisotropic layer 14, or the rod-like liquid crystal compound used for forming the third optically anisotropic layer 16 contains a reverse wavelength dispersion liquid crystal compound.

In a case where a plurality of liquid crystal compounds are used for forming each of the first optically anisotropic layer 12A, the second optically anisotropic layer 14, and the third optically anisotropic layer 16, at least one of the plurality of liquid crystal compounds may be a reverse wavelength dispersion liquid crystal compound.

That is, in a case where a plurality of liquid crystal compounds are used for forming each of the first optically anisotropic layer 12A, the second optically anisotropic layer 14, and the third optically anisotropic layer 16, a mixture of a reverse wavelength dispersion liquid crystal compound and a forward wavelength dispersion liquid crystal compound may be used.

In a case where a plurality of liquid crystal compounds are used, the content of the reverse wavelength dispersion liquid crystal compound is often 1% to 90% by mass with respect to the total mass of the liquid crystal compound. From the viewpoint that the effect of the present invention is more excellent, the content of the reverse wavelength dispersion liquid crystal compound is preferably 5% to 50% by mass and more preferably 20% to 40% by mass with respect to the total mass of the liquid crystal compound.

The reverse wavelength dispersion liquid crystal compound refers to a liquid crystal compound in which an Re value or an Rth value increases as a measurement wavelength increases in a case where the in-plane retardation (Re) value at a specific wavelength (visible light range) of a phase difference film prepared by aligning (horizontally aligning) this liquid crystal compound is measured.

A polymerizable liquid crystal compound having a partial structure represented by Formula (11) is preferable as the reverse wavelength dispersion liquid crystal compound.

*-D$^1$-Ar-D$^2$-*      (II)

In Formula (II), D$^1$ and D$^2$ each independently represent a single bond, —O—, —CO—, —CO—O—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—CR$^3$R$^4$—O—CO—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—.

R$^1$, R$^2$, R$^3$, and R$^4$ each independently represent a hydrogen atom, a fluorine atom, or an alkyl group having 1 to 4 carbon atoms, and In a case where there are a plurality of each of R$^1$'s, R$^2$'s, R$^3$'s, and R$^4$'s, the plurality of R's, the plurality of R$^2$'s, the plurality of R$^3$'s, and the plurality of R$^4$'s each may be the same as or different from each other, Ar represents any aromatic ring selected from the group consisting of groups represented by Formulae (Ar-1) to (Ar-7). In Formulae (Ar-1) to (Ar-7), * represents a bonding position with D$^1$ or D$^2$, and the description of the reference numerals in Formulae (Ar-1) to (Ar-7) is the same as that described by Ar in Formulae (III) which will be described later.

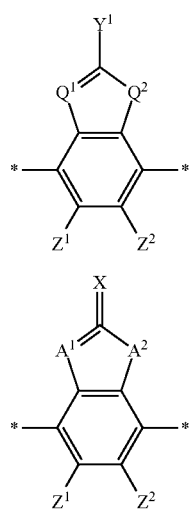

(Ar-1)

(Ar-2)

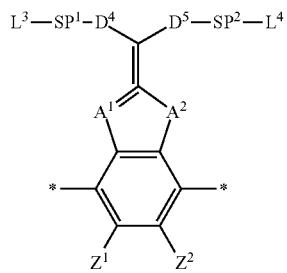

(Ar-3)

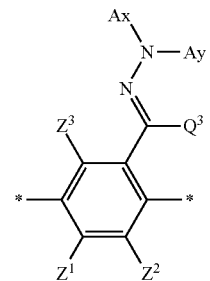

(Ar-4)

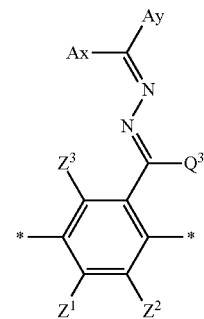

(Ar-5)

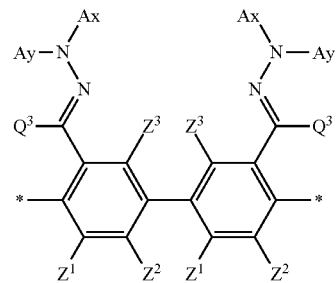

(Ar-6)

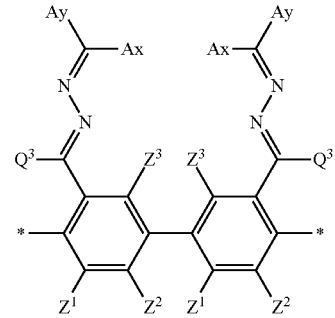

(Ar-7)

A polymerizable liquid crystal compound represented by Formula (III) is preferable as the polymerizable liquid crystal compound having the partial structure represented by Formula (II).

The polymerizable liquid crystal compound represented by Formula (III) is a compound exhibiting liquid crystallinity.

$$L^1\text{-}G^1\text{-}D^1\text{-}Ar\text{-}D^2\text{-}G^2\text{-}L^2 \quad (III)$$

In Formula (III), $D^1$ and $D^2$ each independently represent a single bond, —O—, —CO—, —CO—O—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—CR$^3$R$^4$—O—CO—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—.

$R^1$, $R^2$, $R^3$, and $R^4$ each independently represent a hydrogen atom, a fluorine atom, or an alkyl group having 1 to 4 carbon atoms, and In a case where there are a plurality of each of $R^1$'s, $R^2$'s, $R^3$'s, and $R^4$'s, the plurality of $R^1$'s, the plurality of $R^2$'s, the plurality of $R^3$'s, and the plurality of $R^4$'s each may be the same as or different from each other.

$G^1$ and $G^2$ each independently represent a divalent alicyclic hydrocarbon group having 5 to 8 carbon atoms or an aromatic hydrocarbon group, and the methylene group contained in the alicyclic hydrocarbon group may be substituted with —O—, —S—, or —NH—.

$L^1$ and $L^2$ each independently represent a monovalent organic group, and at least one selected from the group consisting of $L^1$ and $L^2$ represents a monovalent group having a polymerizable group.

Ar represents any aromatic ring selected from the group consisting of groups represented by Formulae (Ar-1) to (Ar-7). In Formulae (Ar-1) to (Ar-7), * represents a bonding position with $D^1$ or $D^2$.

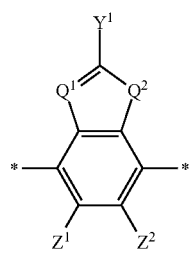

(Ar-1)

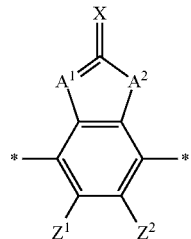

(Ar-2)

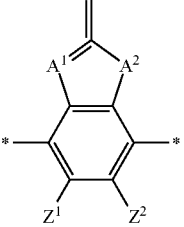

(Ar-3)

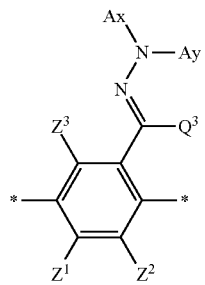

(Ar-4)

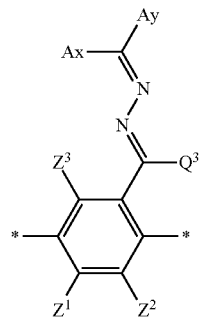

(Ar-5)

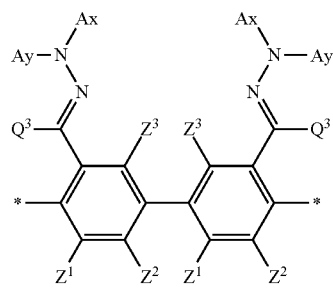

(Ar-6)

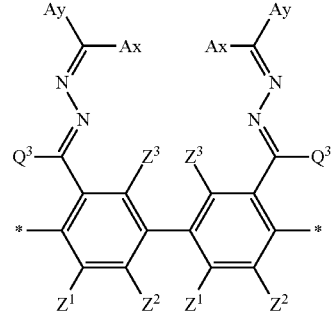

(Ar-7)

In Formula (Ar-1), $Q^1$ represents N or CH, $Q^2$ represents —S—, —O—, or —N(R$^7$)—, $R^7$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, each of which may have a substituent.

Examples of the alkyl group having 1 to 6 carbon atoms represented by $R^7$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include aryl groups of a phenyl group, a 2,6-diethylphenyl group, and a naphthyl group.

Examples of the aromatic heterocyclic group having 3 to 12 carbon atoms represented by $Y^1$ include heteroaryl groups of a thienyl group, a thiazolyl group, a furyl group, and a pyridyl group.

In addition, examples of the substituent that $Y^1$ may have include an alkyl group, an alkoxy group, and a halogen atom.

The alkyl group is preferably an alkyl group having 1 to 18 carbon atoms, more preferably an alkyl group having 1 to 8 carbon atoms, still more preferably an alkyl group having 1 to 4 carbon atoms, and particularly preferably a methyl group or an ethyl group. The alkyl group may be linear, branched, or cyclic.

The alkoxy group is, for example, preferably an alkoxy group having 1 to 18 carbon atoms, more preferably an alkoxy group having 1 to 8 carbon atoms, still more preferably an alkoxy group having 1 to 4 carbon atoms, and particularly preferably a methoxy group or an ethoxy group.

Examples of the halogen atom include a fluorine atom, a chlorine atom, a bromine atom, and an iodine atom, among which a fluorine atom or a chlorine atom is preferable.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^8$, —$NR^9R^{10}$, or —$SR^{11}$, $R^8$ to $R^{11}$ each independently represent a hydrogen atom or an alkyl group having 1 to 6 carbon atoms, and $Z^1$ and $Z^2$ may be bonded to each other to form an aromatic ring.

The monovalent aliphatic hydrocarbon group having 1 to 20 carbon atoms is preferably an alkyl group having 1 to 15 carbon atoms, more preferably an alkyl group having 1 to 8 carbon atoms, still more preferably a methyl group, an ethyl group, an isopropyl group, a tert-pentyl group (1,1-dimethylpropyl group), a tert-butyl group, or a 1,1-dimethyl-3,3-dimethyl-butyl group, and particularly preferably a methyl group, an ethyl group, or a tert-butyl group.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and cyclodecadiene; and polycyclic saturated hydrocarbon groups such as a bicyclo[2.2.1]heptyl group, a bicyclo[2.2.2]octyl group, a tricyclo[5.2.1.0$^{2-6}$]decyl group, a tricyclo[3.3.1.1$^{3,7}$]decyl group, a tetracyclo[6.2.1.1$^{3,6}$.0$^{2,7}$]dodecyl group, and an adamantyl group.

Examples of the monovalent aromatic hydrocarbon group having 6 to 20 carbon atoms include a phenyl group, a 2,6-diethylphenyl group, a naphthyl group, and a biphenyl group, among which an aryl group having 6 to 12 carbon atoms (particularly, a phenyl group) is preferable.

Examples of the halogen atom include a fluorine atom, a chlorine atom, a bromine atom, and an iodine atom, among which a fluorine atom, a chlorine atom, or a bromine atom is preferable.

In addition, in Formulae (Ar-2) and (Ar-3), $A^1$ and $A^2$ each independently represent a group selected from the group consisting of —O—, —N($R^{12}$)—, —S—, and —CO—, and $R^{12}$ represents a hydrogen atom or a substituent.

Examples of the substituent represented by $R^{12}$ include the same substituents that $Y^1$ in Formula (Ar-1) may have.

In addition, in Formula (Ar-2), X represents a non-metal atom of Groups 14 to 16 to which a substituent may be bonded.

Examples of the non-metal atom of Groups 14 to 16 represented by X include an oxygen atom, a sulfur atom, a nitrogen atom to which a hydrogen atom or a substituent is bonded [=N—$R^{N1}$ where $R^{N1}$ represents a hydrogen atom or a substituent], and a carbon atom to which a hydrogen atom or a substituent is bonded [=C—($R^{C1}$)$_2$ where $R^{C1}$ represents a hydrogen atom or a substituent]. CN is preferable as the substituent of $R^{N1}$ or $R^{C1}$.

In addition, in Formula (Ar-3), $D^4$ and $D^5$ each independently represent a single bond, or —CO—, —O—, —S—, —C(=S)—, —$CR^{1a}R^{2a}$—, —$CR^{3a}=CR^{4a}$—, —$NR^{5a}$— or a divalent linking group consisting of a combination of two or more thereof, and $R^{1a}$ to $R^{5a}$ each independently represent a hydrogen atom, a fluorine atom, or an alkyl group having 1 to 4 carbon atoms.

Here, examples of the divalent linking group include —CO—, —O—, —CO—O—, —C(=S)O—, —$CR^{1b}R^{2b}$—, —$CR^{1b}R^{2b}$—$CR^{1b}R^{2b}$—, —O—$CR^{1b}R^{2b}$—, —$CR^{1b}R^{2b}$—O—$CR^{1b}R^{2b}$—, —CO—O—$CR^{1b}R^{2b}$—, —O—CO—$CR^{1b}R^{2b}$—, —$CR^{1b}R^{2b}$—O—CO—$CR^{1b}R^{2b}$—, —$CR^{1b}R^{2b}$—CO—O—$CR^{1b}R^{2b}$—, —$NR^{3b}$—$CR^{1b}R^{2b}$—, and —CO—$NR^{3b}$—. $R^{1b}$, $R^{2b}$, and $R^{3b}$ each independently represent a hydrogen atom, a fluorine atom, or an alkyl group having 1 to 4 carbon atoms.

In addition, in Formula (Ar-3), $SP^1$ and $SP^2$ each independently represent a single bond, a linear or branched alkylene group having 1 to 12 carbon atoms, or a divalent linking group in which one or more of —$CH_2$— constituting a linear or branched alkylene group having 1 to 12 carbon atoms are substituted with —O—, —S—, —NH—, —N(Q)-, or —CO—, and Q represents a substituent. Examples of the substituent include the same substituents that $Y^1$ in Formula (Ar-1) may have.

In addition, in Formula (Ar-3), $L^3$ and $L^4$ each independently represent a monovalent organic group.

Examples of the monovalent organic group include an alkyl group, an aryl group, and a heteroaryl group. The alkyl group may be linear, branched, or cyclic and is preferably linear. The number of carbon atoms in the alkyl group is preferably 1 to 30, more preferably 1 to 20, and still more preferably 1 to 10. In addition, the aryl group may be monocyclic or polycyclic and is preferably monocyclic. The number of carbon atoms in the aryl group is preferably 6 to 25 and more preferably 6 to 10. In addition, the heteroaryl group may be monocyclic or polycyclic. The number of heteroatoms constituting the heteroaryl group is preferably 1 to 3. The heteroatom constituting the heteroaryl group is preferably a nitrogen atom, a sulfur atom, or an oxygen atom. The number of carbon atoms in the heteroaryl group is preferably 6 to 18 and more preferably 6 to 12. In addition, the alkyl group, the aryl group, and the heteroaryl group may be unsubstituted or may have a substituent. Examples of the substituent include the same substituents that $Y^1$ in Formula (Ar-1) may have.

In addition, in Formulae (Ar-4) to (Ar-7), Ax represents an organic group having 2 to 30 carbon atoms which has at least one aromatic ring selected from the group consisting of an aromatic hydrocarbon ring and an aromatic heterocyclic ring.

In addition, in Formulae (Ar-4) to (Ar-7), Ay represents a hydrogen atom, an alkyl group having 1 to 12 carbon atoms which may have a substituent, or an organic group having 2 to 30 carbon atoms which has at least one aromatic ring selected from the group consisting of an aromatic hydrocarbon ring and an aromatic heterocyclic ring.

Here, the aromatic rings in Ax and Ay may have a substituent, and Ax and Ay may be bonded to each other to form a ring.

In addition, $Q^3$ represents a hydrogen atom or an alkyl group having 1 to 6 carbon atoms which may have a substituent.

Examples of Ax and Ay include those described in paragraphs [0039] to [0095] of WO2014/010325A.

In addition, specific examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same substituents that $Y^1$ in Formula (Ar-1) may have.

With regard to the definition and preferred range of each substituent of the liquid crystal compound represented by Formula (III), the descriptions regarding $D^1$, $D^2$, $G^1$, $G^2$, $L^1$, $L^2$, $R^4$, $R^5$, $R^6$, $R^7$, $X^1$, $Y^1$, $Q^1$, and $Q^2$ for Compound (A) described in JP2012-021068A can be referred to for $D_1$, $D_2$, $G_1$, $G_2$, $L_1$, $L_2$, $R^1$, $R^2$, $R^3$, $R^4$, $Q_1$, $Y_1$, $Z_1$, and $Z_2$, respectively; the descriptions regarding $A_1$, $A_2$, and X for the compound represented by General Formula (I) described in JP2008-107767A can be referred to for $A_1$, $A_2$, and X, respectively; and the descriptions regarding Ax, Ay, and $Q^1$ for the compound represented by General Formula (I) described in WO 2013/018526A can be referred to for Ax, Ay, and $Q_2$, respectively. The description of $Q^1$ for Compound (A) described in JP2012-21068A can be referred to for $Z_3$.

In particular, the organic groups represented by $L^1$ and $L^2$ are each preferably a group represented by -$D^3$-$G^3$-Sp-$P^3$.

$D^3$ has the same definition as in $D^1$.

$G^3$ represents a single bond, a divalent aromatic ring group or heterocyclic group having 6 to 12 carbon atoms, or a divalent alicyclic hydrocarbon group having 5 to 8 carbon atoms, and the methylene group contained in the alicyclic hydrocarbon group may be substituted with —O—, —S—, or —$NR^7$—, and $R^7$ represents a hydrogen atom or an alkyl group having 1 to 6 carbon atoms.

Sp represents a spacer group represented by a single bond, —(CH$_2$)$_n$—, —(CH$_2$)$_n$—O—, —(CH$_2$—O—)$_n$—, —(CH$_2$CH$_2$—O—)$_m$, —O—(CH$_2$)$_n$—, —O—(CH$_2$)$_n$—O—, —O—(CH$_2$—O—)$_n$—, —O—(CH$_2$CH$_2$—O—)$_m$, —C(=O)—O—(CH$_2$)$_n$—, —C(=O)—O—(CH$_2$)$_n$—O—, —C(=O)—O(CH$_2$—O—)$_n$—, —C(=O)—O—(CH$_2$CH$_2$—O—)$_m$, —C(=O)—N($R^8$)—(CH$_2$)$_n$—, —C(=O)—N($R^8$)—(CH$_2$)$_n$—O—, —C(=O)—N($R^8$)—(CH$_2$—O—)$_n$—, —C(=O)—N($R^8$)—(CH$_2$CH$_2$—O—)$_m$, or —(CH$_2$)$_n$—O—(C=O)—(CH$_2$)$_n$—C(=O)—O—(CH$_2$)$_n$—. Here, n represents an integer of 2 to 12, m represents an integer of 2 to 6, and $R^8$ represents a hydrogen atom or an alkyl group having 1 to 6 carbon atoms. In addition, the hydrogen atom of —CH$_2$—in each of the above groups may be substituted with a methyl group.

$P^3$ represents a polymerizable group.

The polymerizable group is not particularly limited and is preferably a polymerizable group capable of radical polymerization or cationic polymerization.

Examples of the radically polymerizable group include known radically polymerizable groups, among which an acryloyl group or a methacryloyl group is preferable. The acryloyl group is generally known to have a high polymerization rate and therefore the acryloyl group is preferable from the viewpoint of improving productivity; whereas the methacryloyl group can also be used as the polymerizable group of a highly birefringent liquid crystal.

Examples of the cationically polymerizable group include known cationically polymerizable groups, examples of which include an alicyclic ether group, a cyclic acetal group, a cyclic lactone group, a cyclic thioether group, a spiroorthoester group, and a vinyloxy group. Of these, an alicyclic ether group or a vinyloxy group is preferable, and an epoxy group, an oxetanyl group, or a vinyloxy group is more preferable.

The forward wavelength dispersion liquid crystal compound refers to a liquid crystal compound in which an Re value or an Rth value decreases as a measurement wavelength increases in a case where the in-plane retardation (Re) value at a specific wavelength (visible light range) of a phase difference film prepared by aligning (horizontally aligning) this liquid crystal compound is measured.

Above all, the second optically anisotropic layer 14 is preferably a layer formed of a liquid crystal compound containing a reverse wavelength dispersion liquid crystal compound, from the viewpoint that the effect of the present invention is more excellent.

In other words, it is preferable that the second optically anisotropic layer 14 is a layer formed by fixing a rod-like liquid crystal compound twist-aligned along a helical axis extending in a thickness direction, and the rod-like liquid crystal compound contains a reverse wavelength dispersion liquid crystal compound.

As will be described later, in a case where the second optically anisotropic layer 14 is formed by using a composition for forming an optically anisotropic layer, it is preferable to form the second optically anisotropic layer 14 by using a composition for forming an optically anisotropic layer containing a reverse wavelength dispersion rod-like liquid crystal compound.

Other Members

The optical film 10A may include members other than the above-mentioned first optically anisotropic layer 12A to third optically anisotropic layer 16.

Fourth Optically Anisotropic Layer

The optical film 10A may include a fourth optically anisotropic layer on the side of the first optically anisotropic layer 12A opposite to the second optically anisotropic layer 14 side.

The fourth optically anisotropic layer is a layer formed by fixing a horizontally aligned disk-like liquid crystal compound.

The state in which a disk-like liquid crystal compound is horizontally aligned means that the disc plane of the disk-like liquid crystal compound and the main surface of the layer are parallel to each other. It is not required to be strictly parallel, and the angle formed by the disc plane and the main surface of the layer is preferably in a range of 0° to 20° and more preferably in a range of 0° to 10°.

The thickness direction retardation of the fourth optically anisotropic layer at a wavelength of 550 nm is not particularly limited, and is preferably 5 to 100 nm and more preferably 10 to 90 nm from the viewpoint that the effect of the present invention is more excellent.

A known compound can be used as the disk-like liquid crystal compound.

Examples of the disk-like liquid crystal compound include the disk-like liquid crystal compound exemplified in the first optically anisotropic layer 12A.

The disk-like liquid crystal compound may have a polymerizable group.

The types of polymerizable groups that the disk-like liquid crystal compound may have are as described above.

The fourth optically anisotropic layer is preferably a layer formed by fixing a disk-like liquid crystal compound horizontally aligned and having a polymerizable group by polymerization.

The average thickness of the fourth optically anisotropic layer is not particularly limited, and is preferably 10 µm or less, more preferably 0.1 to 5.0 µm, and still more preferably 0.3 to 2.0 µm.

The average thickness is obtained by measuring the thicknesses of any five or more points of the fourth optically anisotropic layer and arithmetically averaging the measured values.

Adhesion Layer

The optical film 10A may have an adhesion layer between the optically anisotropic layers.

Examples of the adhesion layer include known pressure sensitive adhesive layers and adhesive layers.

Alignment Film

The optical film 10A may further have an alignment film. The alignment film may be arranged between the optically anisotropic layers.

As shown in FIG. 1, it is preferable that the optical film 10A does not have an alignment film between the optically anisotropic layers.

The alignment film can be formed by means such as rubbing treatment of an organic compound (preferably a polymer), oblique vapor deposition of an inorganic compound, formation of a layer having microgrooves, or accumulation of an organic compound (for example, ω-tricosanoic acid, dioctadecylmethylammonium chloride, or methyl stearate) by the Langmuir-Blodgett method (LB film).

Further, there is also known an alignment film capable of expressing an alignment function by application of an electric field, application of a magnetic field, or light (preferably polarized light) irradiation.

The alignment film is preferably formed by a rubbing treatment of a polymer.

Examples of the alignment film include a photo-alignment film.

The thickness of the alignment film is not particularly limited as long as it can exhibit an alignment function, and is preferably 0.01 to 5.0 µm, more preferably 0.05 to 2.0 µm, and still more preferably 0.1 to 0.5 µm.

Substrate

The optical film 10A may further have a substrate.

The substrate is preferably a transparent substrate. The transparent substrate is intended to refer to a substrate having a visible light transmittance of 60% or more, which preferably has a visible light transmittance of 80% or more and more preferably 90% or more.

The thickness of the substrate is not particularly limited, and is preferably 10 to 200 µm, more preferably 10 to 100 µm, and still more preferably 20 to 90 µm.

In addition, the substrate may consist of a plurality of layers laminated. In order to improve the adhesion of the substrate to the layer provided thereon, the surface of the substrate may be subjected to a surface treatment (for example, a glow discharge treatment, a corona discharge treatment, an ultraviolet (UV) treatment, or a flame treatment).

In addition, an adhesive layer (undercoat layer) may be provided on the substrate.

The substrate may be a so-called temporary support. For example, after producing an optically anisotropic layer on a substrate, the substrate may be peeled off from the optically anisotropic layer, if necessary.

Method for Producing Optical Film

The method for producing an optical film is not particularly limited, and a known method can be used.

For example, an optical film can be produced by preparing each of the first optically anisotropic layer to the third optically anisotropic layer and bonding the prepared optically anisotropic layers in a predetermined order through an adhesion layer (for example, a pressure sensitive adhesive layer or an adhesive layer).

In addition, the first optically anisotropic layer to the third optically anisotropic layer can be produced by using compositions for forming an optically anisotropic layer containing a liquid crystal compound having a polymerizable group, which can be formed respectively.

Hereinafter, the method for producing an optically anisotropic layer (first optically anisotropic layer to third optically anisotropic layer) using the composition for forming an optically anisotropic layer containing a liquid crystal compound having a polymerizable group will be described in detail.

The liquid crystal compound having a polymerizable group (hereinafter, also referred to as "polymerizable liquid crystal compound") contained in the composition for forming an optically anisotropic layer is as described above. As described above, a rod-like liquid crystal compound and a disk-like liquid crystal compound are appropriately selected according to the characteristics of an optically anisotropic layer to be formed.

The content of the polymerizable liquid crystal compound in the composition for forming an optically anisotropic layer is preferably 60% to 99% by mass and more preferably 70% to 98% by mass with respect to the total solid content of the composition for forming an optically anisotropic layer.

The solid content means a component capable of forming an optically anisotropic layer from which a solvent has been removed, and even in a case where a component itself is in a liquid state, such a component is regarded as the solid content.

The composition for forming an optically anisotropic layer may contain a compound other than the liquid crystal compound having a polymerizable group.

For example, the composition for forming an optically anisotropic layer for forming the second optically anisotropic layer 14 preferably contains a chiral agent in order to twist-align a liquid crystal compound. The chiral agent is added to twist-align a liquid crystal compound, but of course, it is not necessary to add the chiral agent in a case where the liquid crystal compound is a compound exhibiting an optical activity such as having an asymmetric carbon in a molecule thereof. In addition, it is not necessary to add the chiral agent, depending on the production method and the twisted angle.

The chiral agent is not particularly limited in a structure thereof as long as it is compatible with the liquid crystal compound used in combination. Any of the known chiral agents (for example, "Liquid Crystal Device Handbook" edited by the 142nd Committee of the Japan Society for the Promotion of Science, Chapter 3, 4-3, Chiral agent for TN and STN, p. 199, 1989) can be used.

The amount of the chiral agent used is not particularly limited and is adjusted such that the above-mentioned twisted angle is achieved.

The composition for forming an optically anisotropic layer may contain a polymerization initiator. The polymerization initiator used is selected according to the type of polymerization reaction, and examples thereof include a thermal polymerization initiator and a photopolymerization initiator.

The content of the polymerization initiator in the composition for forming an optically anisotropic layer is preferably 0.01 to 20% by mass and more preferably 0.5 to 10% by mass with respect to the total solid content of the composition for forming an optically anisotropic layer.

Examples of other components that may be contained in the composition for forming an optically anisotropic layer include a polyfunctional monomer, an alignment control agent (a vertical alignment agent and a horizontal alignment agent), a surfactant, an adhesion improver, a plasticizer, and a solvent, in addition to the foregoing components.

Examples of the method of applying the composition for forming an optically anisotropic layer include a curtain coating method, a dip coating method, a spin coating method, a printing coating method, a spray coating method, a slot coating method, a roll coating method, a slide coating method, a blade coating method, a gravure coating method, and a wire bar method.

Next, the formed coating film is subjected to an alignment treatment to align a polymerizable liquid crystal compound in the coating film. For example, in a case where the first optically anisotropic layer 12A is formed, a disk-like liquid crystal compound is vertically aligned such that the optical axis (the axis orthogonal to the disc plane) of the disk-like liquid crystal compound is arranged in the same direction. In addition, in a case where the second optically anisotropic layer 14 is formed, a rod-like liquid crystal compound is twist-aligned. In addition, in a case where the third optically anisotropic layer 16 is formed, a rod-like liquid crystal compound is vertically aligned. In addition, in a case where the fourth optically anisotropic layer is formed, a disk-like liquid crystal compound is horizontally aligned.

The alignment treatment can be carried out by drying the coating film at room temperature or by heating the coating film. In a case of a thermotropic liquid crystal compound, the liquid crystal phase formed by the alignment treatment can generally be transferred by a change in temperature or pressure.

The conditions for heating the coating film are not particularly limited, and the heating temperature is preferably 50° C. to 250° C. and more preferably 50° C. to 150° C., and the heating time is preferably 10 seconds to 10 minutes.

In addition, after the coating film is heated, the coating film may be cooled, if necessary, before a curing treatment (light irradiation treatment) which will be described later.

Next, the coating film in which the polymerizable liquid crystal compound is aligned is subjected to a curing treatment.

The method of the curing treatment carried out on the coating film in which the polymerizable liquid crystal compound is aligned is not particularly limited, and examples thereof include a light irradiation treatment and a heat treatment. Above all, from the viewpoint of manufacturing suitability, a light irradiation treatment is preferable, and an ultraviolet irradiation treatment is more preferable.

The irradiation conditions of the light irradiation treatment are not particularly limited, and an irradiation amount of 50 to 1,000 mJ/cm$^2$ is preferable.

The atmosphere during the light irradiation treatment is not particularly limited and is preferably a nitrogen atmosphere.

The total thickness of the optically anisotropic layers contained in the optical film is not particularly limited, and is preferably 10 μm or less and more preferably 5 m or less from the viewpoint of thinning. The lower limit of the total thickness of the optically anisotropic layers is not particularly limited, and is preferably 0.1 μm or more.

The optically anisotropic layer contained in the optical film includes at least the above-mentioned first optically anisotropic layer, second optically anisotropic layer, and third optically anisotropic layer, and in a case where the optically anisotropic layer includes another optically anisotropic layer other than the first optically anisotropic layer, the second optically anisotropic layer, and the third optically anisotropic layer, the other optically anisotropic layer is also included in the optically anisotropic layer contained in the optical film.

First Embodiment of Circularly Polarizing Plate

The first embodiment of the optical film according to the embodiment of the present invention can be used as a circularly polarizing plate in combination with a polarizer. The circularly polarizing plate is an optical element that converts unpolarized light into circularly polarized light.

The circularly polarizing plate according to the embodiment of the present invention having the above configuration is suitably used for antireflection applications of a display device such as a liquid crystal display device (LCD), a plasma display panel (PDP), an electroluminescent display (ELD), or a cathode tube display device (CRT).

The polarizer may be a member having a function of converting natural light into specific linearly polarized light, and examples thereof include an absorption type polarizer.

The type of the polarizer is not particularly limited, and a commonly used polarizer can be used. Examples of the polarizer include an iodine-based polarizer, a dye-based polarizer using a dichroic substance, and a polyene-based polarizer. The iodine-based polarizer and the dye-based polarizer are generally prepared by adsorbing iodine or a dichroic dye on a polyvinyl alcohol, followed by stretching.

A protective film may be arranged on one side or both sides of the polarizer.

The polarizer is preferably a polarizer formed of a composition containing a dichroic substance and a liquid crystal compound having a polymerizable group.

The dichroic substance is not particularly limited, and conventionally known dichroic substances (dichroic coloring agents) can be used including a visible light absorbing substance (a dichroic coloring agent), a luminescent substance (a fluorescent substance, a phosphorescent substance), an ultraviolet absorbing substance, an infrared absorbing substance, a nonlinear optical substance, a carbon nanotube, and an inorganic substance (for example, a quantum rod).

In the present invention, two or more dichroic substances may be used in combination. For example, from the viewpoint of bringing a light absorption anisotropic film closer to black, it is preferable to use at least one coloring agent compound having a maximum absorption wavelength in a wavelength range of 370 to 550 nm and at least one coloring agent compound having a maximum absorption wavelength in a wavelength range of 500 to 700 nm in combination.

The luminosity corrected single transmittance of the polarizer is not particularly limited, and is preferably 42% or more and more preferably 43% or more from the viewpoint that the effect of the present invention is more excellent. The upper limit of the luminosity corrected single transmittance of the polarizer is not particularly limited, and is preferably 48% or less.

The luminosity corrected single transmittance is calculated by the following method.

For the polarizer, a transmittance (T1) in an absorption axis direction in a wavelength range of 380 to 780 nm and a transmittance (T2) in a direction orthogonal to the absorption axis are measured using a spectrophotometer with an integrating sphere ["V7100" manufactured by JASCO Corporation], and a single transmittance at each wavelength is calculated based on the following expression.

Single transmittance(%)=(T1+T2)/2

Regarding the obtained single transmittance, luminosity correction is carried out by a two-degree field of view (C light source) of JIS Z 8701: 1999 "Color display method—XYZ color system and X10Y10Z10 color system", and a luminosity corrected single transmittance is obtained.

Figure 2:
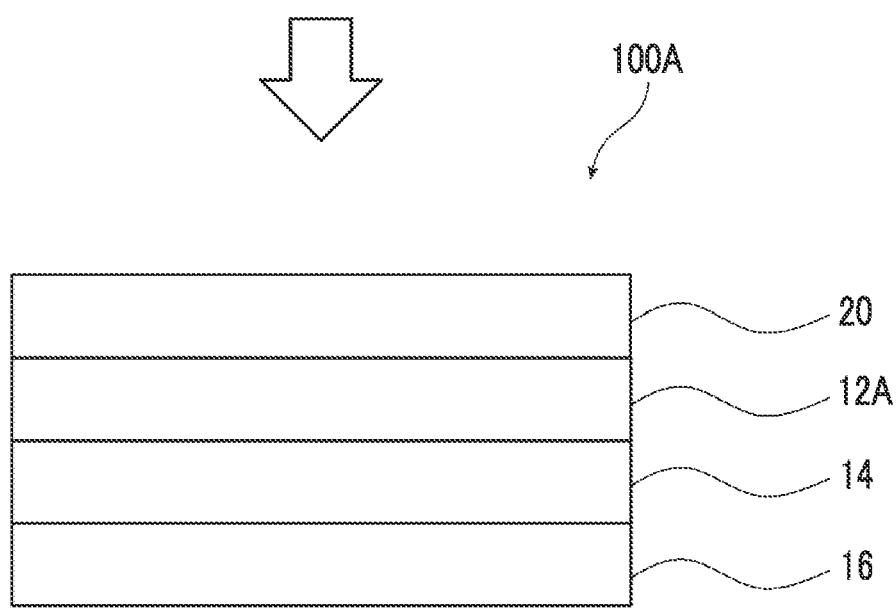
FIG. 2 is an example of a schematic cross-sectional view of a first embodiment of a circularly polarizing plate of the present invention.
Figure 3:
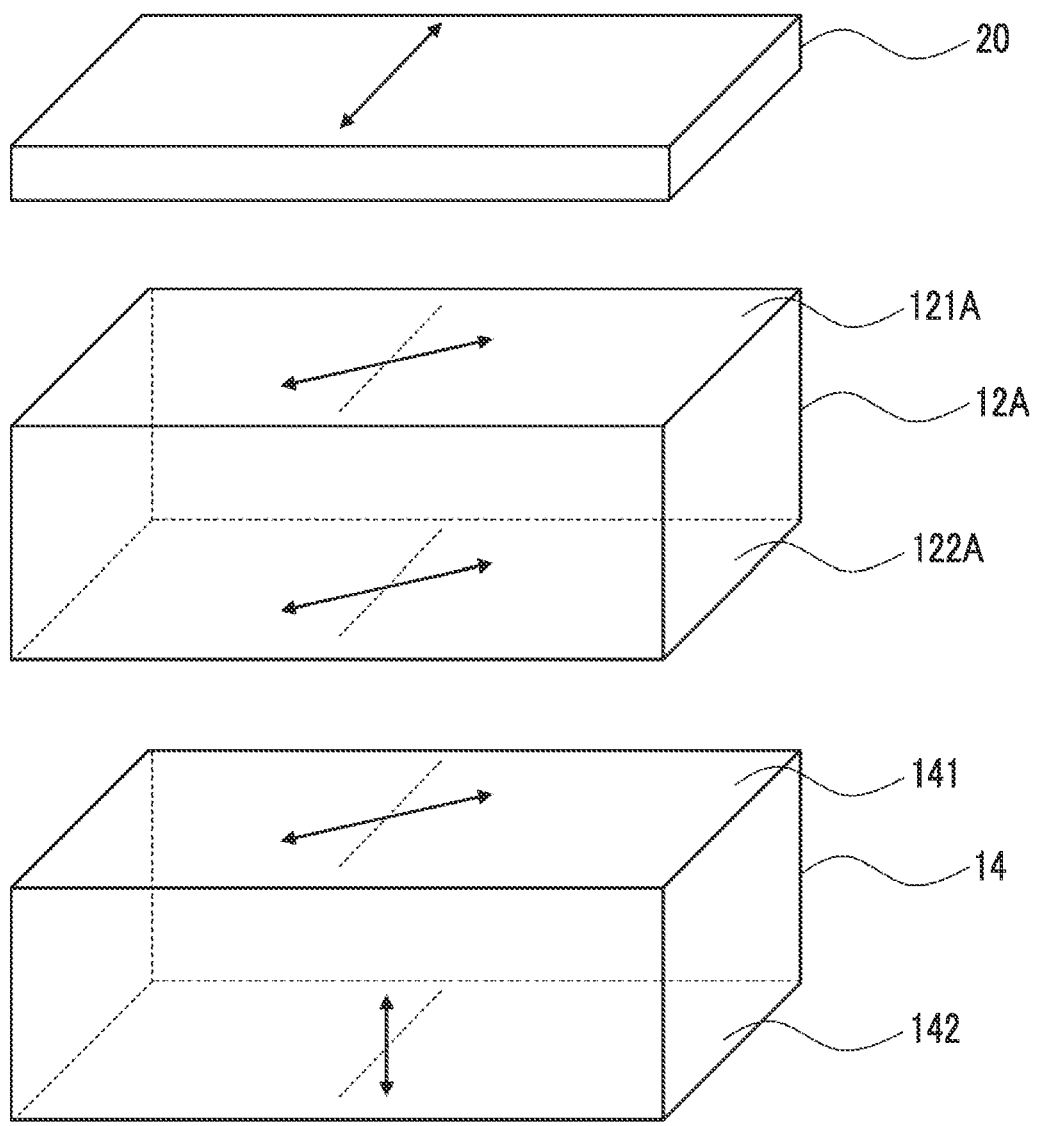
FIG. 3 is a view showing a relationship between an absorption axis of a polarizer and an in-plane slow axis of each of a first optically anisotropic layer and a second optically anisotropic layer in the first embodiment of the circularly polarizing plate of the present invention.

FIG. 2 shows a schematic cross-sectional view of an embodiment of a circularly polarizing plate 100A. In addition, FIG. 3 is a view showing a relationship between an absorption axis of a polarizer 20 and an in-plane slow axis of each of the first optically anisotropic layer 12A and the second optically anisotropic layer 14 in the circularly polarizing plate 100A shown in FIG. 2. In FIG. 3, the arrow in the polarizer 20 indicates an absorption axis, and the arrow in the first optically anisotropic layer 12A and the second optically anisotropic layer 14 indicates an in-plane slow axis in each layer.

Figure 4:
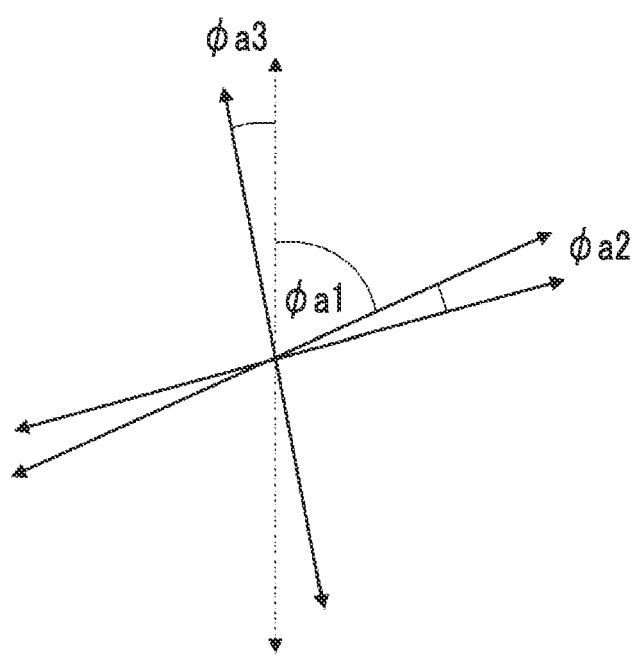
FIG. 4 is a schematic diagram showing a relationship of an angle between the absorption axis of the polarizer and the in-plane slow axis of each of the first optically anisotropic layer and the second optically anisotropic layer, upon observation from the direction of a white arrow in FIG. 2.

In addition, FIG. 4 is a view showing a relationship of the angle between the absorption axis (broken line) of the polarizer 20 and the in-plane slow axis (solid line) of each of the first optically anisotropic layer 12A and the second optically anisotropic layer 14, upon observation from the white arrow in FIG. 2.

The rotation angle of the in-plane slow axis is represented by a positive angle value in a counterclockwise direction and a negative angle value in a clockwise direction, with respect to the absorption axis of the polarizer 20 (0°), upon observation from the white arrow in FIG. 2. In addition, whether the twisted direction of the liquid crystal compound is a right-handed twist (clockwise) or a left-handed twist (counterclockwise) is determined with reference to the in-plane slow axis on the surface of the front side (the polarizer 20 side) in the second optically anisotropic layer 14, upon observation from the white arrow in FIG. 2.

As shown in FIG. 2, the circularly polarizing plate 100A includes the polarizer 20, the first optically anisotropic layer 12A, the second optically anisotropic layer 14, and the third optically anisotropic layer 16 in this order.

As shown in FIG. 3 and FIG. 4, an angle mal formed by the absorption axis of the polarizer 20 and the in-plane slow axis of the first optically anisotropic layer 12A is 76°. More specifically, the in-plane slow axis of the first optically anisotropic layer 12A is rotated by −76° (clockwise 76°) with respect to the absorption axis of the polarizer 20. FIG. 3 and FIG. 4 show an aspect in which the in-plane slow axis of the first optically anisotropic layer 12A is at a position of −76°, but the present invention is not limited to this aspect. It is preferably in a range of −40° to −85°, more preferably in a range of −50° to −85°, and still more preferably in a range of −65° to −85°. That is, the angle formed by the absorption axis of the polarizer 20 and the in-plane slow axis of the first optically anisotropic layer 12A is preferably in a range of 40° to 85°, more preferably in a range of 50° to 85°, and still more preferably in a range of 65° to 85°.

As shown in FIG. 3, in the first optically anisotropic layer 12A, the in-plane slow axis on a surface 121A of the first optically anisotropic layer 12A on the polarizer 20 side is parallel to the in-plane slow axis on a surface 122A of the first optically anisotropic layer 12A on the second optically anisotropic layer 14 side.

As shown in FIG. 3 and FIG. 4, the angle formed by the in-plane slow axis of the first optically anisotropic layer 12A and the in-plane slow axis on a surface 141 of the second optically anisotropic layer 14 on the first optically anisotropic layer 12A side is 6°. More specifically, the in-plane slow axis on the surface 141 of the second optically anisotropic layer 14 on the first optically anisotropic layer 12A side is rotated by −6° (clockwise 6°) with respect to the in-plane slow axis of the first optically anisotropic layer 12A.

The present invention is not limited to this aspect, and the angle formed by the in-plane slow axis of the first optically anisotropic layer 12A and the in-plane slow axis on the surface 141 of the second optically anisotropic layer 14 on the first optically anisotropic layer 12A side is preferably in a range of 0° to 20°.

As described above, the second optically anisotropic layer 14 is a layer formed by fixing a rod-like liquid crystal compound twist-aligned along a helical axis extending in a thickness direction. Therefore, as shown in FIG. 3 and FIG. 4, the in-plane slow axis on the surface 141 of the second optically anisotropic layer 14 on the first optically anisotropic layer 12A side and the in-plane slow axis on the surface 142 of the second optically anisotropic layer 14 opposite to the first optically anisotropic layer 12A side form the above-mentioned twisted angle (87° in FIG. 3). That is, the angle formed by the in-plane slow axis on the surface 141 of the second optically anisotropic layer 14 on the first optically anisotropic layer 12A side and the in-plane slow axis on the surface 142 of the second optically anisotropic layer 14 opposite to the first optically anisotropic layer 12A side is 87°. More specifically, the twisted direction of the rod-like liquid crystal compound in the second optically anisotropic layer 14 is a left-handed twist (counterclockwise), and the twisted angle is 87°. Therefore, an angle φa3 formed by the absorption axis of the polarizer 20 and the in-plane slow axis on the surface 142 of the second optically anisotropic layer 14 opposite to the first optically anisotropic layer 12A side is 5°.

Although FIG. 3 and FIG. 4 show an aspect in which the twisted angle of the rod-like liquid crystal compound in the second optically anisotropic layer 14 is 87°, the present invention is not limited to this aspect. As described above, the twisted angle of the rod-like liquid crystal compound is preferably within a range of 80°±30°. That is, the angle formed by the in-plane slow axis on the surface 141 of the second optically anisotropic layer 14 on the first optically anisotropic layer 12A side and the in-plane slow axis on the surface 142 of the second optically anisotropic layer 14 opposite to the first optically anisotropic layer 12A side is preferably within a range of 80°±30°.

As described above, in the aspect of FIG. 3 and FIG. 4, the in-plane slow axis of the first optically anisotropic layer 12A is rotated clockwise by 76°, and the twisted direction of the rod-like liquid crystal compound in the second optically anisotropic layer 14 is counterclockwise (left-handed twist), with reference to the absorption axis of the polarizer 20, upon observation of the circularly polarizing plate 100A from the polarizer 20 side.

In FIG. 3 and FIG. 4, the aspect in which the twisted direction of the rod-like liquid crystal compound is counterclockwise is described in detail, but an aspect in which the twisted direction of the rod-like liquid crystal compound is clockwise may be configured as long as the relationship of a predetermined angle is satisfied. More specifically, it may be an aspect in which the in-plane slow axis of the first optically anisotropic layer 12A is rotated counterclockwise by 76°, and the twisted direction of the rod-like liquid crystal compound in the second optically anisotropic layer 14 is clockwise (right-handed twist), with reference to the absorption axis of the polarizer 20, upon observation of the circularly polarizing plate 100A from the polarizer 20 side.

That is, in the circularly polarizing plate including the first embodiment of the optical film, in a case where the in-plane slow axis of the first optically anisotropic layer is rotated clockwise within a range of 40° to 85° (preferably 50° to 85° and more preferably 65° to 85°) with reference to the absorption axis of the polarizer, upon observation of the circularly polarizing plate from the polarizer side, it is preferable that the twisted direction of the rod-like liquid crystal compound in the second optically anisotropic layer is counterclockwise with reference to the in-plane slow axis on the surface of the second optically anisotropic layer on the first optically anisotropic layer side.

In addition, in the circularly polarizing plate including the first embodiment of the optical film, in a case where the in-plane slow axis of the first optically anisotropic layer is rotated counterclockwise within a range of 40° to 85° (preferably 50° to 85° and more preferably 65° to 85°) with reference to the absorption axis of the polarizer, upon observation of the circularly polarizing plate from the polarizer side, it is preferable that the twisted direction of the rod-like liquid crystal compound in the second optically anisotropic layer is clockwise with reference to the in-plane slow axis on the surface of the second optically anisotropic layer on the first optically anisotropic layer side.

The circularly polarizing plate may have a member other than the optical film and the polarizer.

The circularly polarizing plate may have an adhesion layer between the optical film and the polarizer.

Examples of the adhesion layer include the above-mentioned known pressure sensitive adhesive layers and adhesive layers.

The method for producing a circularly polarizing plate is not particularly limited, and a known method can be mentioned.

For example, a method of bonding a polarizer and an optical film through an adhesion layer can be mentioned.

Second Embodiment of Optical Film

Figure 5:
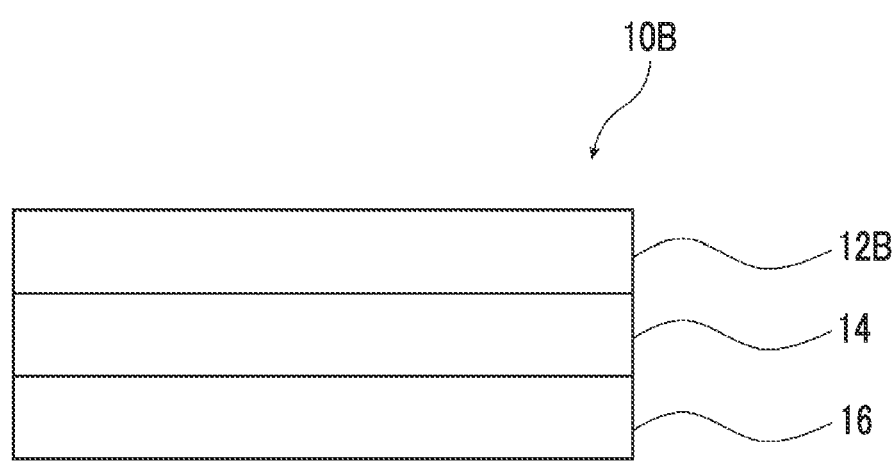
FIG. 5 is an example of a schematic cross-sectional view of a second embodiment of the optical film of the present invention.

Hereinafter, the second embodiment of the optical film according to the embodiment of the present invention will be described with reference to the accompanying drawings. FIG. 5 shows a schematic cross-sectional view of the second embodiment of the optical film according to the embodiment of the present invention.

An optical film 10B has a first optically anisotropic layer 12B, a second optically anisotropic layer 14, and a third optically anisotropic layer 16 in this order.

The first optically anisotropic layer 12B is a layer formed by fixing a horizontally aligned rod-like liquid crystal compound, the second optically anisotropic layer 14 is a layer formed by fixing a rod-like liquid crystal compound twist-aligned along a helical axis extending in a thickness direction, and the third optically anisotropic layer 16 is a layer formed by fixing a vertically aligned rod-like liquid crystal compound.

The in-plane slow axis of the first optically anisotropic layer 12B is parallel to the in-plane slow axis on the surface of the second optically anisotropic layer 14 on the first optically anisotropic layer 12B.

In addition, as will be described later, in the second embodiment, at least one of the first optically anisotropic layer 12B, the second optically anisotropic layer 14, or the third optically anisotropic layer 16 is a layer formed of a liquid crystal compound containing a reverse wavelength dispersion liquid crystal compound.

The optical film of the first embodiment and the optical film of the second embodiment has the same configuration except that, in the optical film of the second embodiment, the first optically anisotropic layer 12B is used instead of the first optically anisotropic layer 12A of the optical film of the first embodiment.

Therefore, the first optically anisotropic layer 12B will be mainly described below.

First Optically Anisotropic Layer 12B

The first optically anisotropic layer 12B is a layer formed by fixing a horizontally aligned rod-like liquid crystal compound.

The state in which a rod-like liquid crystal compound is horizontally aligned refers to a state in which a molecular axis of the rod-like liquid crystal compound (corresponding to a major axis of the rod-like liquid crystal compound) is arranged horizontally and in the same direction with respect to the layer surface (optical uniaxiality).

Here, "horizontal" does not require that the molecular axis of the rod-like liquid crystal compound is strictly horizontal with respect to the layer surface, but is intended to mean an alignment in which the tilt angle formed by the average molecular axis of the rod-like liquid crystal compound and the main surface of the layer is less than 20°.

In addition, the same direction does not require that the molecular axis of the rod-like liquid crystal compound is arranged strictly in the same direction with respect to the layer surface, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

The in-plane retardation of the first optically anisotropic layer 12B at a wavelength of 550 nm is not particularly limited, and is preferably 120 to 240 nm and more preferably 130 to 230 nm from the viewpoint that the effect of the present invention is more excellent.

The thickness direction retardation of the first optically anisotropic layer 12B at a wavelength of 550 nm is not particularly limited, and is preferably −120 to −60 nm and more preferably −115 to −65 nm from the viewpoint that the effect of the present invention is more excellent.

A known compound can be used as the rod-like liquid crystal compound.

Examples of the rod-like liquid crystal compound include the rod-like liquid crystal compound exemplified in the second optically anisotropic layer 14.

The rod-like liquid crystal compound may have a polymerizable group.

The types of polymerizable groups that the rod-like liquid crystal compound may have are as described above.

The first optically anisotropic layer 12B is preferably a layer formed by fixing a rod-like liquid crystal compound horizontally aligned and having a polymerizable group by polymerization.

The first optically anisotropic layer 12B may exhibit forward wavelength dispersibility (a characteristic that the in-plane retardation decreases as the measurement wavelength increases) or reverse wavelength dispersibility (a characteristic that the in-plane retardation increases as the measurement wavelength increases). The forward wavelength dispersibility and the reverse wavelength dispersibility are preferably exhibited in a visible light region.

The ratio (Re(450)/Re(550)) of the in-plane retardation of the first optically anisotropic layer 12B at a wavelength of 450 nm to the in-plane retardation of the first optically anisotropic layer 12B at a wavelength of 550 nm is preferably 0.80 to 1.25 and more preferably 1.08 to 1.25.

The ratio (Re(650)/Re(550)) of the in-plane retardation of the first optically anisotropic layer 12B at a wavelength of 650 nm to the in-plane retardation of the first optically anisotropic layer 12B at a wavelength of 550 nm is preferably 0.90 to 1.20 and more preferably 0.92 to 1.00.

The average thickness of the first optically anisotropic layer 12B is not particularly limited, and is preferably 10 μm or less, more preferably 0.1 to 5.0 μm, and still more preferably 0.3 to 2.0 μm.

The average thickness is obtained by measuring the thicknesses of any five or more points of the first optically anisotropic layer 12B and arithmetically averaging the measured values.

In the optical film 10B, at least one of the first optically anisotropic layer 12B, the second optically anisotropic layer 14, or the third optically anisotropic layer 16 is a layer formed of a liquid crystal compound containing a reverse wavelength dispersion liquid crystal compound. The first optically anisotropic layer 12B, the second optically anisotropic layer 14, and the third optically anisotropic layer 16 are preferably formed of a composition for forming an optically anisotropic layer, and at least one of the first optically anisotropic layer 12B, the second optically anisotropic layer 14, or the third optically anisotropic layer 16 is preferably formed of a composition for forming an optically anisotropic layer containing a reverse wavelength dispersion liquid crystal compound.

In other words, at least one of the rod-like liquid crystal compound used for forming the first optically anisotropic layer 12B, the rod-like liquid crystal compound used for forming the second optically anisotropic layer 14, or the rod-like liquid crystal compound used for forming the third optically anisotropic layer 16 contains a reverse wavelength dispersion liquid crystal compound.

In a case where a plurality of liquid crystal compounds are used for forming each of the first optically anisotropic layer 12B, the second optically anisotropic layer 14, and the third optically anisotropic layer 16, at least one of the plurality of liquid crystal compounds may be a reverse wavelength dispersion liquid crystal compound.

In a case where a plurality of liquid crystal compounds are used, the content of the reverse wavelength dispersion liquid crystal compound is often 1% to 90% by mass with respect to the total mass of the liquid crystal compound. From the viewpoint that the effect of the present invention is more excellent, the content of the reverse wavelength dispersion liquid crystal compound is preferably 5% to 50% by mass and more preferably 200 to 40% by mass with respect to the total mass of the liquid crystal compound.

The definition and suitable aspect of the reverse wavelength dispersion liquid crystal compound are as described above.

Above all, the second optically anisotropic layer 14 is preferably a layer formed of a liquid crystal compound containing a reverse wavelength dispersion liquid crystal compound, from the viewpoint that the effect of the present invention is more excellent.

In other words, it is preferable that the second optically anisotropic layer 14 is a layer formed by fixing a rod-like liquid crystal compound twist-aligned along a helical axis extending in a thickness direction, and the rod-like liquid crystal compound contains a reverse wavelength dispersion liquid crystal compound.

As will be described later, in a case where the second optically anisotropic layer 14 is formed by using a composition for forming an optically anisotropic layer, it is preferable to form the second optically anisotropic layer 14 by using a composition for forming an optically anisotropic layer containing a reverse wavelength dispersion rod-like liquid crystal compound.

Other Members

The optical film 10B may include members other than the above-mentioned first optically anisotropic layer 12B to third optically anisotropic layer 16.

Examples of other members include the other members described in the first embodiment of the optical film described above.

The methods for producing the first optically anisotropic layer 12B to the third optically anisotropic layer 16 are not particularly limited, and the above-mentioned methods for producing the first optically anisotropic layer 12A to the third optically anisotropic layer 16 can be mentioned.

Second Embodiment of Circularly Polarizing Plate

The second embodiment of the optical film according to the embodiment of the present invention can be used as a circularly polarizing plate in combination with a polarizer.

The circularly polarizing plate according to the embodiment of the present invention having the above configuration is suitably used for antireflection applications of a display device such as a liquid crystal display device (LCD), a plasma display panel (PDP), an electroluminescent display (ELD), or a cathode tube display device (CRT).

The polarizer is as described in the first embodiment.

Figure 6:
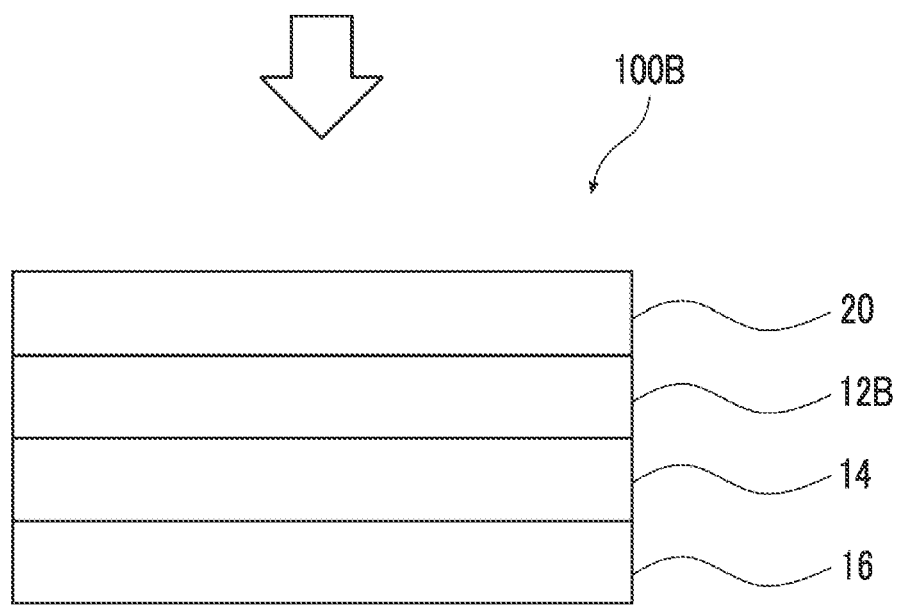
FIG. 6 is an example of a schematic cross-sectional view of a second embodiment of the circularly polarizing plate of the present invention.
Figure 7:
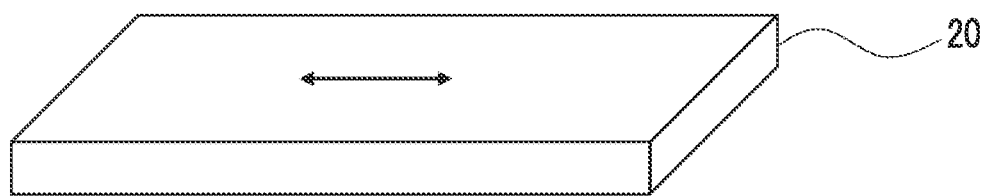
FIG. 7 is a view showing a relationship between an absorption axis of a polarizer and an in-plane slow axis of each of a first optically anisotropic layer and a second optically anisotropic layer in the second embodiment of the circularly polarizing plate of the present invention.
Figure 7:
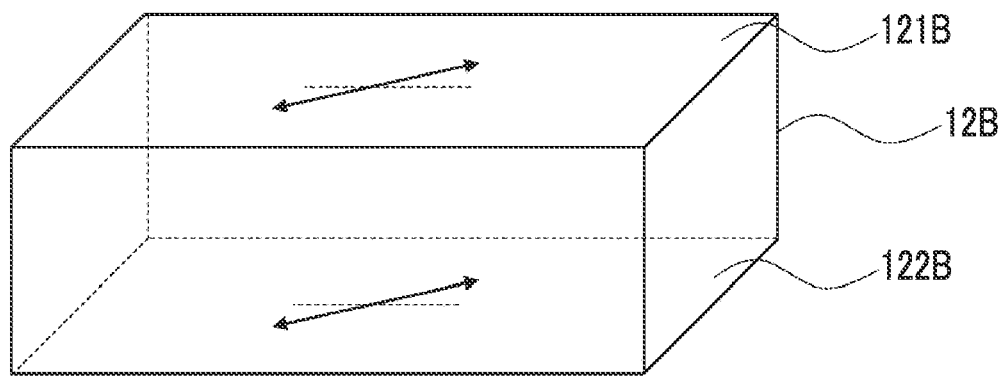
Figure 7:
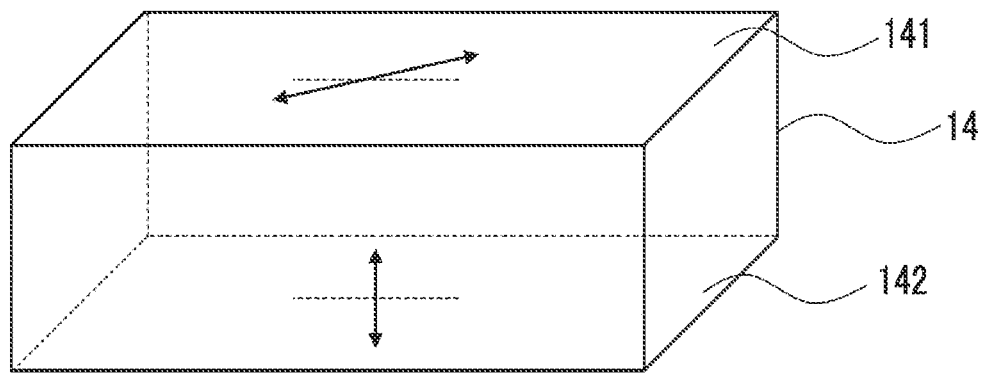

FIG. 6 shows a schematic cross-sectional view of an embodiment of a circularly polarizing plate 100B. In addition, FIG. 7 is a view showing a relationship between an absorption axis of a polarizer 20 and an in-plane slow axis of each of the first optically anisotropic layer 12B and the second optically anisotropic layer 14 in the circularly polarizing plate 100B shown in FIG. 6. In FIG. 7, the arrow in the polarizer 20 indicates an absorption axis, and the arrow in the first optically anisotropic layer 12B and the second optically anisotropic layer 14 indicates an in-plane slow axis in each layer.

Figure 8:
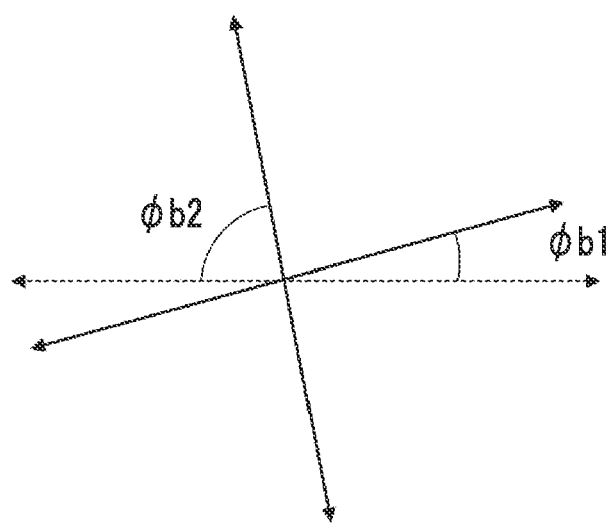
FIG. 8 is a schematic diagram showing a relationship of an angle between the absorption axis of the polarizer and the in-plane slow axis of each of the first optically anisotropic layer and the second optically anisotropic layer, upon observation from the direction of a white arrow in FIG. 6.

In addition, FIG. 8 is a view showing a relationship of the angle between the absorption axis (broken line) of the polarizer 20 and the in-plane slow axis (solid line) of each of the first optically anisotropic layer 12B and the second optically anisotropic layer 14, upon observation from the white arrow in FIG. 6.

The rotation angle of the in-plane slow axis is represented by a positive angle value in a counterclockwise direction and a negative angle value in a clockwise direction, with respect to the absorption axis of the polarizer 20 (0°), upon observation from the white arrow in FIG. 6. In addition, whether the twisted direction is a right-handed twist (clockwise) or a left-handed twist (counterclockwise) is determined with reference to the in-plane slow axis on the surface of the front side (the polarizer 20 side) in the second optically anisotropic layer 14, upon observation from the white arrow in FIG. 6.

As shown in FIG. 6, the circularly polarizing plate 100B includes the polarizer 20, the first optically anisotropic layer 12B, the second optically anisotropic layer 14, and the third optically anisotropic layer 16 in this order.

As shown in FIG. 7 and FIG. 8, an angle φb1 formed by the absorption axis of the polarizer 20 and the in-plane slow axis of the first optically anisotropic layer 12B is 14°. More specifically, the in-plane slow axis of the first optically anisotropic layer 12B is rotated by 14° (counterclockwise 14°) with respect to the absorption axis of the polarizer 20. FIG. 7 and FIG. 8 show an aspect in which the in-plane slow axis of the first optically anisotropic layer 12B is at a position of 14°, but the present invention is not limited to this aspect. It is preferably in a range of 5° to 50°, more preferably in a range of 5° to 40°, and still more preferably in a range of 5° to 25°. That is, the angle formed by the absorption axis of the polarizer 20 and the in-plane slow axis of the first optically anisotropic layer 12B is preferably in a range of 5 to 50°, more preferably in a range of 5 to 40°, and still more preferably in a range of 5 to 25°.

As shown in FIG. 7, in the first optically anisotropic layer 12B, the in-plane slow axis on a surface 121B of the first optically anisotropic layer 12B on the polarizer 20 side is parallel to the in-plane slow axis on a surface 122B of the first optically anisotropic layer 12B on the second optically anisotropic layer 14 side.

As shown in FIG. 7 and FIG. 8, the in-plane slow axis of the first optically anisotropic layer 12B is parallel to the in-plane slow axis on the surface 141 of the second optically anisotropic layer 14 on the first optically anisotropic layer 12B side.

The present invention is not limited to this aspect, and the angle formed by the in-plane slow axis of the first optically anisotropic layer 12B and the in-plane slow axis on the surface 141 of the second optically anisotropic layer 14 on the first optically anisotropic layer 12B side is preferably in a range of 0° to 20°.

As described above, the second optically anisotropic layer 14 is a layer formed by fixing a rod-like liquid crystal compound twist-aligned along a helical axis extending in a thickness direction. Therefore, as shown in FIG. 7 and FIG. 8, the in-plane slow axis on the surface 141 of the second optically anisotropic layer 14 on the polarizer 20 side and the in-plane slow axis on the surface 142 of the second optically anisotropic layer 14 opposite to the polarizer 20 side form the above-mentioned twisted angle (85° in FIG. 7). That is, the angle formed by the in-plane slow axis on the surface 141 of the second optically anisotropic layer 14 on the first optically anisotropic layer 12B side and the in-plane slow axis on the surface 142 of the second optically anisotropic layer 14 opposite to the first optically anisotropic layer 12B side is 85°. More specifically, the twisted direction of the rod-like liquid crystal compound in the second optically anisotropic layer 14 is a left-handed twist (counterclockwise), and the twisted angle is 85°. Therefore, an angle φb2 formed by the absorption axis of the polarizer 20 and the in-plane slow axis on the surface 142 of the second optically anisotropic layer 14 opposite to the first optically anisotropic layer 12B side is 81°.

Although FIG. 7 and FIG. 8 show an aspect in which the twisted angle of the rod-like liquid crystal compound in the second optically anisotropic layer 14 is 85°, the present invention is not limited to this aspect. As described above, the twisted angle of the rod-like liquid crystal compound is preferably within a range of 80°±30°. That is, the angle formed by the in-plane slow axis on the surface 141 of the second optically anisotropic layer 14 on the first optically anisotropic layer 12B side and the in-plane slow axis on the surface 142 of the second optically anisotropic layer 14 opposite to the first optically anisotropic layer 12B side is preferably within a range of 80° 30°.

As described above, in the aspect of FIG. 7 and FIG. 8, the in-plane slow axis of the first optically anisotropic layer 12B is rotated counterclockwise by 14°, and the twisted direction of the rod-like liquid crystal compound in the second optically anisotropic layer 14 is counterclockwise (left-handed twist), with reference to the absorption axis of the polarizer 20, upon observation of the circularly polarizing plate 100B from the polarizer 20 side.

In FIG. 7 and FIG. 8, the aspect in which the twisted direction of the rod-like liquid crystal compound is counterclockwise is described in detail, but an aspect in which the twisted direction of the rod-like liquid crystal compound is clockwise may be configured as long as the relationship of a predetermined angle is satisfied. More specifically, it may be an aspect in which the in-plane slow axis of the first optically anisotropic layer 12B is rotated clockwise by 14°, and the twisted direction of the rod-like liquid crystal compound in the second optically anisotropic layer 14 is clockwise (right-handed twist), with reference to the absorption axis of the polarizer 20, upon observation of the circularly polarizing plate 100B from the polarizer 20 side.

That is, in the circularly polarizing plate including the second embodiment of the optical film, in a case where the in-plane slow axis of the first optically anisotropic layer is rotated counterclockwise within a range of 5° to 50° (preferably 5° to 40° and more preferably 5° to 25°) with reference to the absorption axis of the polarizer, upon observation of the circularly polarizing plate from the polarizer side, it is preferable that the twisted direction of the liquid crystal compound in the second optically anisotropic layer is counterclockwise with reference to the in-plane slow axis on the surface of the second optically anisotropic layer on the first optically anisotropic layer side.

In addition, in the circularly polarizing plate including the second embodiment of the optical film, in a case where the in-plane slow axis of the second optically anisotropic layer is rotated clockwise within a range of 5° to 50° (preferably 5° to 40° and more preferably 5° to 25°) with reference to the absorption axis of the polarizer, upon observation of the circularly polarizing plate from the polarizer side, it is preferable that the twisted direction of the liquid crystal compound in the second optically anisotropic layer is clockwise with reference to the in-plane slow axis on the surface of the second optically anisotropic layer on the first optically anisotropic layer side.

The circularly polarizing plate may have a member other than the optical film and the polarizer.

The circularly polarizing plate may have an adhesion layer between the optical film and the polarizer.

Examples of the adhesion layer include known pressure sensitive adhesive layers and adhesive layers.

The method for producing a circularly polarizing plate is not particularly limited, and a known method can be mentioned.

For example, a method of bonding a polarizer and an optical film through an adhesion layer can be mentioned.

Applications

The above-mentioned optical film can be applied to various applications and can be used, for example, as a so-called λ/4 plate or λ/2 plate by adjusting the optical properties of each optically anisotropic layer.

The λ/4 plate is a plate having a function of converting linearly polarized light having a specific wavelength into circularly polarized light (or circularly polarized light into linearly polarized light). More specifically, the λ/4 plate is a plate in which the in-plane retardation Re at a predetermined wavelength of λ nm is λ/4 (or an odd multiple thereof).

The in-plane retardation (Re(550)) at a wavelength of 550 nm of the λ/4 plate may have an error of about 25 nm centered on an ideal value (137.5 nm), and is, for example, preferably 110 to 160 nm and more preferably 120 to 150 nm.

In addition, the λ/2 plate refers to an optically anisotropic film in which the in-plane retardation Re(λ) at a specific wavelength of λ nm satisfies Re(λ)≈λ/2. This expression may be achieved at any wavelength (for example, 550 nm) in the visible light region. Above all, it is preferable that the in-plane retardation Re(550) at a wavelength of 550 nm satisfies the following relationship.

210 nm≤Re(550)≤300 nm

Display Device

The optical film (first embodiment and second embodiment) and circularly polarizing plate (first embodiment and second embodiment) according to the embodiment of the present invention can be suitably applied to a display device.

The display device according to the embodiment of the present invention has a display element and the above-mentioned optical film or circularly polarizing plate.

In a case where the optical film according to the embodiment of the present invention is applied to a display device, it is preferably applied as the above-mentioned circularly polarizing plate. In this case, the circularly polarizing plate is arranged on the viewing side, and the polarizer is arranged on the viewing side in the circularly polarizing plate.

The display element is not particularly limited, and examples thereof include an organic electroluminescence display element and a liquid crystal display element.

EXAMPLES

Hereinafter, features of the present invention will be described more specifically with reference to Examples and Comparative Examples. The materials, amounts used, proportions, treatment details, and treatment procedure shown in the following Examples can be appropriately changed without departing from the spirit and scope of the present invention. Accordingly, the scope of the present invention should not be construed as being limited by the specific examples given below.

Example 1

Preparation of Cellulose Acylate Film

The following composition was put into a mixing tank, stirred, and further heated at 90° C. for 10 minutes. Then, the obtained composition was filtered through a filter paper having an average pore diameter of 34 μm and a sintered metal filter having an average pore diameter of 10 μm to prepare a dope. The concentration of solid contents of the dope is 23.5% by mass, and the solvent of the dope is methylene chloride/methanol/butanol=81/18/1 (mass ratio).

| Cellulose acylate dope | |
|---|---|
| Cellulose acylate (acetyl substitution degree: 2.86, viscosity average polymerization degree: 310) | 100 parts by mass |
| Sugar ester compound 1 (represented by Formula (S4)) | 6.0 parts by mass |
| Sugar ester compound 2 (represented by Formula (S5)) | 2.0 parts by mass |
| Silica particle dispersion (AEROSIL R972, manufactured by Nippon Aerosil Co., Ltd.) | 0.1 parts by mass |
| Solvent (methylene chloride/ methanol/butanol) | |

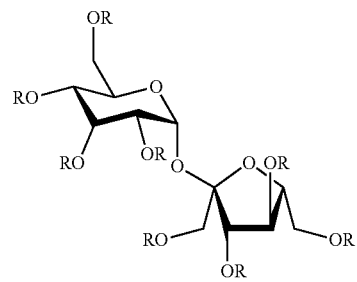

(S4)

(R = benzoyl or H
Average substitution degree: 5.7)

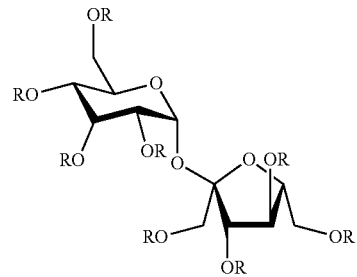

(S5)

(R = acetyl/isobutyryl = 2/6)

The dope prepared above was cast using a drum film forming machine. The dope was cast from a die such that it was in contact with a metal support cooled to 0° C., and then the obtained web (film) was stripped off. The drum was made of SUS.

The web (film) obtained by casting was peeled off from the drum and then dried in a tenter device for 20 minutes at 30° C. to 40° C. during film transport, using the tenter device that clips both ends of the web with clips to transport the film. Subsequently, the web was post-dried by zone heating while being rolled. The obtained web was knurled and then wound up.

The obtained cellulose acylate film had a film thickness of 40 μm, an in-plane retardation of 1 nm at a wavelength of 550 nm, and a thickness direction retardation of 26 nm at a wavelength of 550 nm.

After passing the above-mentioned cellulose acylate film through a dielectric heating roll at a temperature of 60° C. to raise the film surface temperature to 40° C., an alkaline solution having the composition shown below was applied onto a band surface of the film using a bar coater at a coating amount of 14 ml/m², followed by heating to 110° C., and transportation under a steam type far-infrared heater manufactured by Noritake Company Limited for 10 seconds. Subsequently, pure water was applied at 3 ml/m² using the same bar coater. Then, after repeating washing with water with a fountain coater and draining with an air knife three times, the film was transported to a drying zone at 70° C. for 10 seconds and dried to prepare a cellulose acylate film subjected to an alkali saponification treatment.

| Alkaline solution | |
|---|---|
| Potassium hydroxide | 4.7 parts by mass |
| Water | 15.8 parts by mass |
| Isopropanol | 63.7 parts by mass |
| Surfactant: $C_{14}H_{29}O(CH_2CH_2O)_{20}H$ | 1.0 parts by mass |
| Propylene glycol | 14.8 parts by mass |

Formation of Alignment Film

An alignment film coating liquid 1 having the following composition was continuously applied onto the surface of the cellulose acylate film that had been subjected to the alkali saponification treatment with a #14 wire bar. Then, the obtained coating film was dried with hot air at 60° C. for 60 seconds and further with hot air at 100° C. for 120 seconds to obtain an alignment film 1.

| Alignment film coating liquid 1 | |
|---|---|
| Modified polyvinyl alcohol given below | 28 parts by mass |
| Citric acid ester (AS3, manufactured by Sankyo Chemical Co., Ltd.) | 1.2 parts by mass |
| Photopolymerization initiator (Irgacure 2959, manufactured by BASF SE) | 0.84 parts by mass |
| Glutaraldehyde | 2.8 parts by mass |
| Water | 699 parts by mass |
| Methanol | 226 parts by mass |

Modified Polyvinyl Alcohol

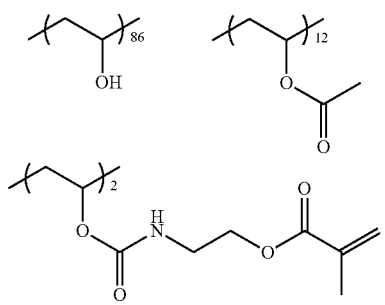

Formation of Optically Anisotropic Layer (A1)

The alignment film 1 prepared above was continuously subjected to a rubbing treatment. At this time, the longitudinal direction and the transport direction of the elongated film (cellulose acylate film) were parallel, and the angle formed by the film longitudinal direction (transport direction) and the rubbing roller rotation axis was 76°. In a case where the film longitudinal direction (transport direction) is 90° and the clockwise direction is represented by a positive value with reference to a film width direction as a reference (0°) in a case of being observed from the film side, the rotation axis of the rubbing roller is at −14°. In other words, the position of the rotation axis of the rubbing roller upon observation from the film side is a position rotated by 76° clockwise with reference to the longitudinal direction of the film.

A composition (A1) for forming an optically anisotropic layer containing a disk-like liquid crystal compound having the following composition was applied onto the rubbing-treated alignment film using a Geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm²) at 80° C. to immobilize the alignment of the disk-like liquid crystal compound to form an optically anisotropic layer (A1) corresponding to the second optically anisotropic layer.

The average thickness of the optically anisotropic layer (A1) was 1.0 μm. In addition, the in-plane retardation at a wavelength of 550 nm was 152 nm. It was confirmed that the average tilt angle of the disc plane of the disk-like liquid crystal compound with respect to the film surface was 90°, and the disk-like liquid crystal compound was aligned perpendicular to the film surface.

In addition, assuming that the angle of the in-plane slow axis of the optically anisotropic layer (A1) is parallel to the rotation axis of the rubbing roller, and the width direction of the film is 0° (the counterclockwise direction is 90° and the clockwise direction is −90° in a longitudinal direction), the in-plane slow axis direction of the optically anisotropic layer (A1) was −14° in a case of viewing from the optically anisotropic layer (A1) side.

| Composition (A1) for forming optically anisotropic layer | |
|---|---|
| Disk-like liquid crystal compound 1 given below | 80 parts by mass |
| Disk-like liquid crystal compound 2 given below | 20 parts by mass |
| Alignment film interface alignment agent 1 given below | 0.55 parts by mass |
| Fluorine-containing compound A given below | 0.1 parts by mass |
| Fluorine-containing compound B given below | 0.05 parts by mass |
| Fluorine-containing compound C given below | 0.21 parts by mass |
| Ethylene oxide-modified trimethylolpropane triacrylate (V # 360, manufactured by Osaka Organic Chemical Industry Ltd.) | 10 parts by mass |
| Photopolymerization ini tiator (Irgacure 907, manufactured by BASF SE) | 3.0 parts by mass |
| Methyl ethyl ketone | 200 parts by mass |

Disk-Like Liquid Crystal Compound 1

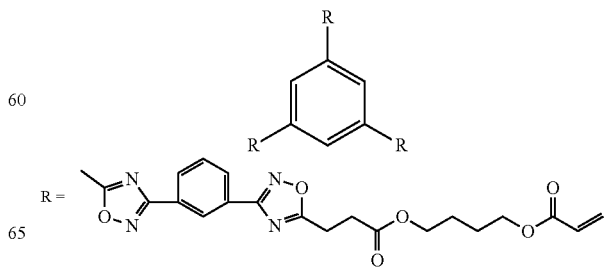

Disk-Like Liquid Crystal Compound 2

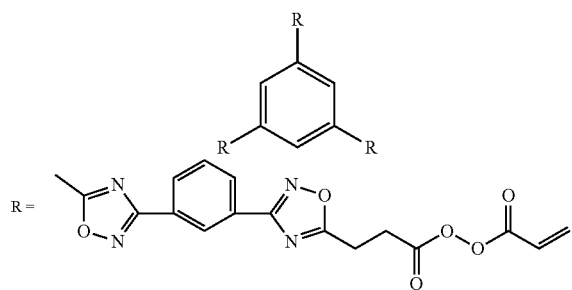

Alignment Film Interface Alignment Agent 1

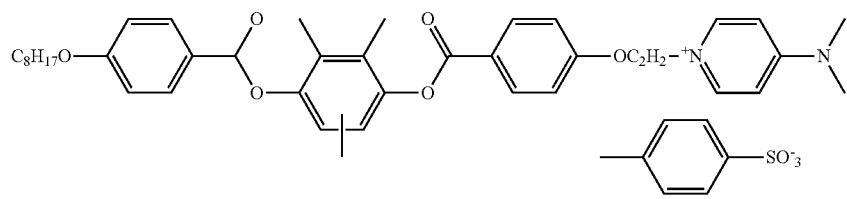

Fluorine-containing compound A (in the following formula, a and b represent the content (% by mass) of each repeating unit with respect to all the repeating units, a represents 90% by mass, and b represents 10% by mass)

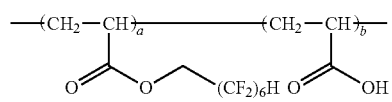

Fluorine-containing compound B (The numerical value in each repeating unit represents the content (% by mass) with respect to all the repeating units, the content of the repeating unit on the left side was 32.5% by mass, and the content of the repeating unit on the right side was 67.5% by mass.)

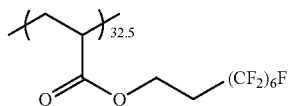

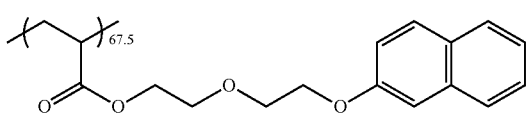

Fluorine-containing compound C (The numerical value in each repeating unit represents the content (% by mass) with respect to all the repeating units, the content of the repeating unit on the left side was 25% by mass, the content of the repeating unit in the middle was 25% by mass, and the content of the repeating unit on the right side was 50% by mass)

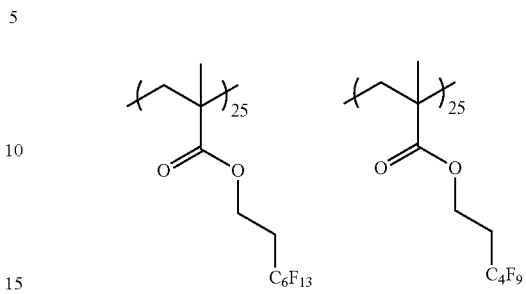

-continued

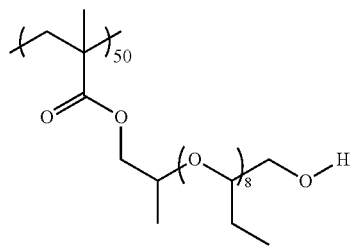

Formation of Optically Anisotropic Layer (C1)

A composition (C1) for forming an optically anisotropic layer containing a rod-like liquid crystal compound having the following composition was applied onto the cellulose acylate film prepared above using a Geeser coating machine to form a composition layer. After that, both ends of the film were held, a cooling plate (9° C.) was installed on the side of the surface on which the coating film of the film was formed so that the distance from the film was 5 mm, and a heater (75° C.) was installed on the side opposite to the surface on which the coating film of the film was formed so that the distance from the film was 5 mm, followed by drying for 2 minutes.

Next, the obtained film was heated with hot air at 60° C. for 1 minute, and irradiated with ultraviolet rays having an irradiation amount of 100 mJ/cm$^2$ using a 365 nm UV-LED while purging with nitrogen so as to have an atmosphere having an oxygen concentration of 100 ppm by volume or less. Then, the obtained coating film was annealed with hot air at 120° C. for 1 minute to form an optically anisotropic layer (C1).

The obtained optically anisotropic layer (C1) was irradiated with UV light (ultra-high pressure mercury lamp; UL750, manufactured by HOYA Corporation) passing through a wire grid polarizer at room temperature at 7.9 mJ/cm² (wavelength: 313 nm) to form a composition layer having an alignment control ability on the surface.

The film thickness of the formed optically anisotropic layer (C1) was 0.7 μm. The in-plane retardation at a wavelength of 550 nm was 0 nm, and the thickness direction retardation at a wavelength of 550 nm was −80 nm. It was confirmed that the average tilt angle of the major axis direction of the rod-like liquid crystal compound with respect to the film surface was 90°, and the rod-like liquid crystal compound was aligned perpendicular to the film surface.

| Composition (C1) for forming optically anisotropic layer | |
|---|---|
| Rod-like liquid crystal compound (A) given below | 100 parts by mass |
| Polymerizable monomer (A-400, manufactured by Shin-Nakamura Chemical Co., Ltd.) | 4.0 parts by mass |
| Polymerization initiator S-1 (oxime type) given below | 5.0 parts by mass |
| Photoacid generator D-1 given below | 3.0 parts by mass |
| Polymer M-1 given below | 2.0 parts by mass |
| Vertical alignment agent S01 given below | 2.0 parts by mass |
| Photo-alignable polymer A-1 given below | 2.0 parts by mass |
| Surfactant B-1 given below | 0.2 parts by mass |
| Methyl ethyl ketone | 42.3 parts by mass |
| Methyl isobutyl ketone | 627.5 parts by mass |

Rod-Like Liquid Crystal Compound (A) (Hereinafter, a Mixture of Compounds)

Photoacid Generator D-1

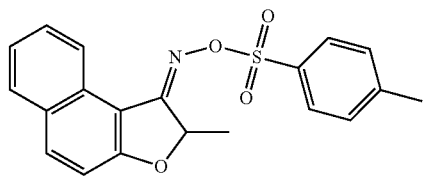 [SMILES: Cc1ccc(S(=O)(=O)O/N=C2/c3c(ccc4ccccc34)OC2C)cc1]

Polymer M-1 (The numerical value in each repeating unit represents the content (% by mass) with respect to all the repeating units, the content of the repeating unit on the left side is 80% by mass, and the content of the repeating unit on the right side is 20% by mass.)

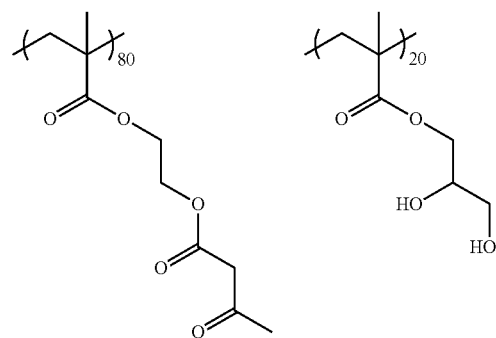

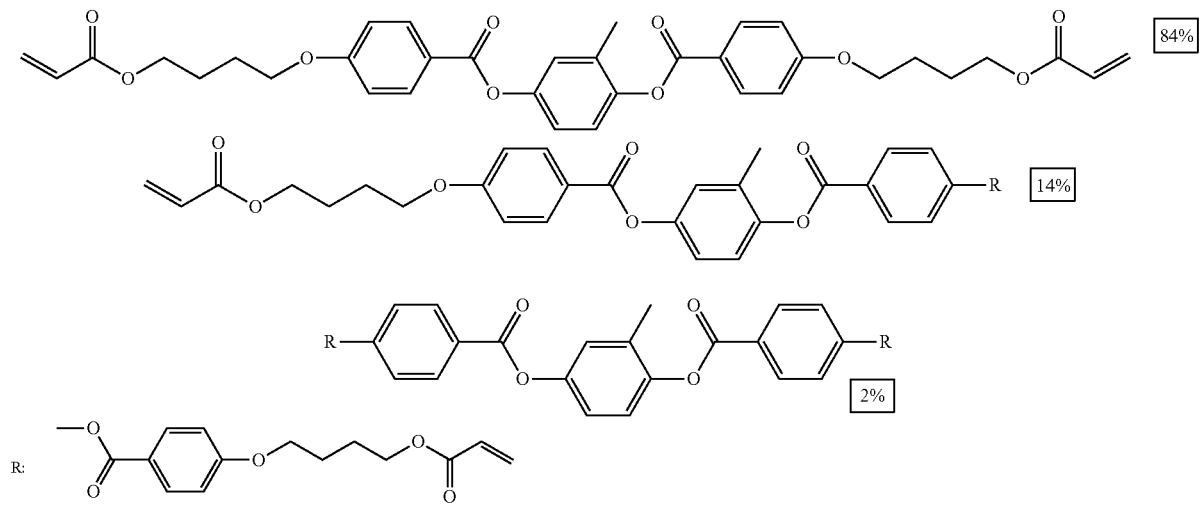

Polymerization Initiator S-1

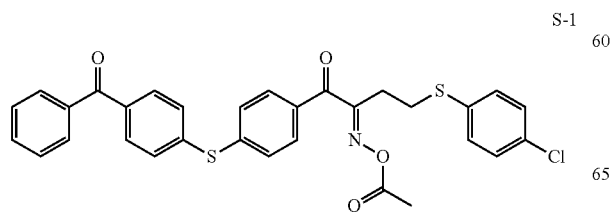

S-1

Vertical Alignment Agent S01

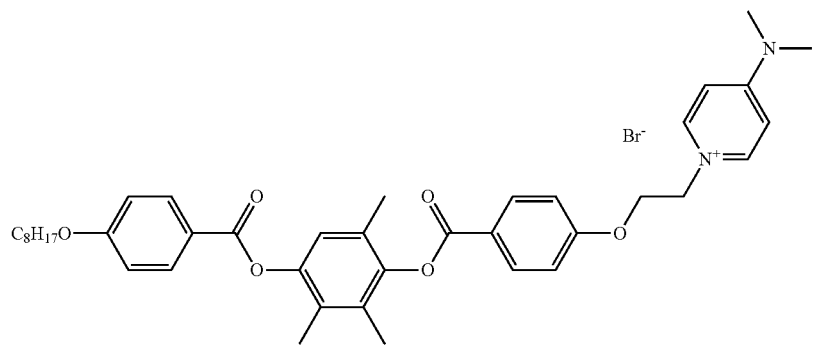

Photo-alignable polymer A-1 (The numerical value described in each repeating unit represents the content (% by mass) of each repeating unit with respect to all the repeating units, which was 43% by mass, 27% by mass, and 30% by mass from the left repeating unit. In addition, the weight-average molecular weight was 69,800.)

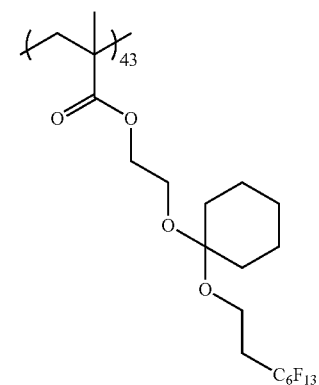

-continued

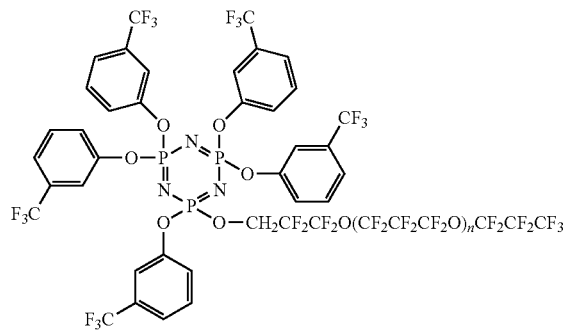

Surfactant B-1 (weight-average molecular weight was 2,200)

Formation of Optically Anisotropic Layer (B1)

Next, a composition (B1) for forming an optically anisotropic layer containing a rod-like liquid crystal compound having the following composition was applied onto the optically anisotropic layer (C1) prepared above by using a Geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (B1).

The optically anisotropic layer (B1) had an average thickness of 1.3 μm, And of 176 nm at a wavelength of 550 nm, and a twisted angle of a liquid crystal compound of 87°. Assuming that the width direction of the film is defined as 0° (the longitudinal direction of the film is defined as 90°), the in-plane slow axis direction (alignment axis angle of the liquid crystal compound) was 8° on the air side and 95° on the side in contact with the optically anisotropic layer (C1), in a case of viewing from the optically anisotropic layer (B1) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observing the substrate from the surface side of the optically anisotropic layer.

| Composition (B1) for forming optically anisotropic layer | |
|---|---|
| Rod-like liquid crystal compound (A) given above | 74 parts by mass |
| Rod-like liquid crystal compound (B) given below | 18 parts by mass |
| Rod-like liquid crystal compound (C) given below | 8 parts by mass |
| Ethylene oxide-modified trimethylolpropane triacrylate (V # 360, manufactured by Osaka Organic Chemical Industry Ltd.) | 4 parts by mass |
| Photopolymerization initiator (Irgacure 819, manufactured by BASF SE) | 3 parts by mass |
| Left-handed twisting chiral agent (L1) given below | 0.60 parts by mass |
| Fluorine-containing compound C given above | 0.08 parts by mass |
| Methyl ethyl ketone | 215 parts by mass |
| Cyclopentanone | 215 parts by mass |

Rod-like liquid crystal compound (B) (corresponding to a reverse wavelength dispersion liquid crystal compound. tBu represents a tert-butyl group.)

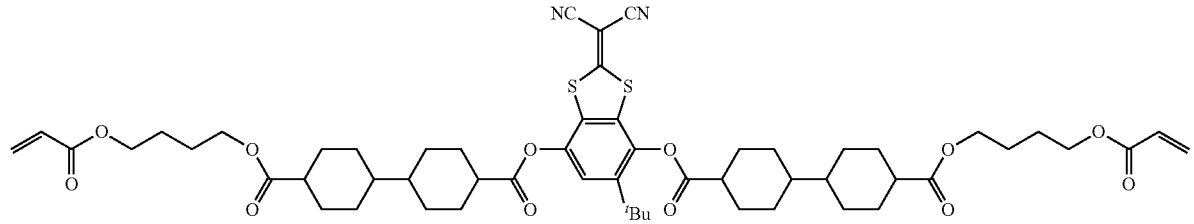 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Rod-like liquid crystal compound (C) (corresponding to a reverse wavelength dispersion liquid crystal compound)

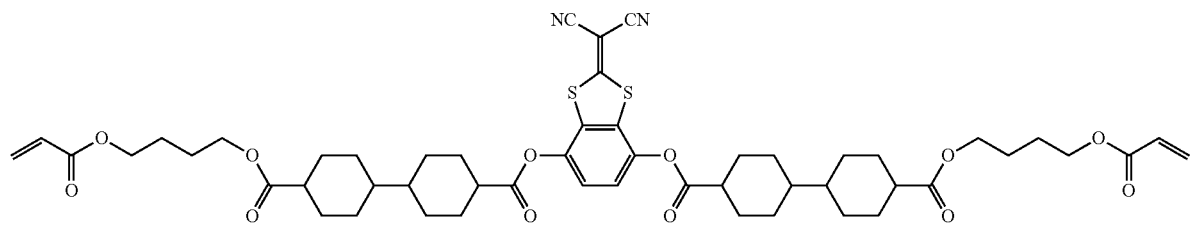 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Left-Handed Twisting Chiral Agent (L1) (tBu Represents a Tert-Butyl Group)

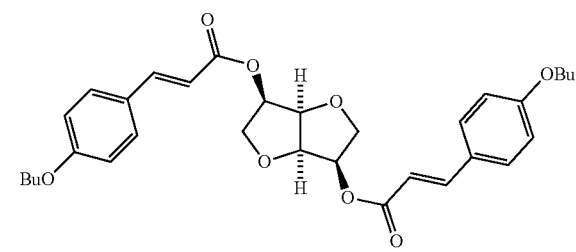

A laminate (B1-C1) in which the optically anisotropic layer (C1) and the optically anisotropic layer (B1) were directly laminated on an elongated cellulose acylate film was prepared by the above procedure.

The surface side of the optically anisotropic layer (A1) formed on the above prepared elongated cellulose acylate film, and the surface side of the optically anisotropic layer (B1) of the laminate (B1-C1) formed on the above prepared elongated cellulose acylate film were continuously bonded to each other using an ultraviolet curable adhesive such that the longitudinal direction of the film of the optically anisotropic layer (A1) and the longitudinal direction of the film of the optically anisotropic layer (B1) were parallel to each other.

Subsequently, the cellulose acylate film on the optically anisotropic layer (A1) side was peeled off to expose the surface of the optically anisotropic layer (A1) in contact with the cellulose acylate film. In this manner, an optical film (C1-B1-A1) in which the optically anisotropic layer (C1), the optically anisotropic layer (B1), and the optically anisotropic layer (A1) were laminated in this order on an elongated cellulose acylate film was obtained.

Preparation of Linearly Polarizing Plate

The surface of a support of a cellulose triacetate film TJ25 (manufactured by Fujifilm Corporation, thickness: 25 μm) was subjected to an alkali saponification treatment. Specifically, the support was immersed in a 1.5 N sodium hydroxide aqueous solution at 55° C. for 2 minutes, washed in a water bath at room temperature, and further neutralized with 0.1 N sulfuric acid at 30° C. After neutralization, the support was washed in a water bath at room temperature and further dried with hot air at 100° C. to obtain a polarizer protective film.

A roll-like polyvinyl alcohol (PVA) film having a thickness of 60 μm was continuously stretched in an aqueous iodine solution in a longitudinal direction and dried to obtain a polarizer having a thickness of 13 μm. The luminosity corrected single transmittance of the polarizer was 43%. At this time, the absorption axis direction and the longitudinal direction of the polarizer were the same.

The polarizer protective film was bonded to one surface of the polarizer using the following PVA adhesive to prepare a linearly polarizing plate.

Preparation of PVA Adhesive 100 parts by mass of a polyvinyl alcohol-based resin having an acetoacetyl group (average degree of polymerization: 1200, degree of saponification: 98.5 mol %, degree of acetoacetylation: 5 mol %) and 20 parts by mass of methylol melamine were dissolved in pure water under a temperature condition of 30° C. to prepare a PVA adhesive as an aqueous solution adjusted to a concentration of solid contents of 3.7% by mass.

Preparation of Circularly Polarizing Plate

The surface of the optically anisotropic layer (A1) of the above prepared elongated optical film (C1-B1-A1) and the surface of the polarizer (the surface opposite to the polarizer protective film) of the above prepared elongated linearly polarizing plate were continuously bonded to each other using an ultraviolet curable adhesive.

Subsequently, the cellulose acylate film on the optically anisotropic layer (C1) side was peeled off to expose the surface of the optically anisotropic layer (C1) in contact with the cellulose acylate film. In this manner, a circularly polarizing plate (P1) consisting of the optical film (C1-B1-A1) and the linearly polarizing plate was prepared. At this time, the polarizer protective film, the polarizer, the optically anisotropic layer (A1), the optically anisotropic layer (B1), and the optically anisotropic layer (C1) were laminated in this order, and the angle formed by the absorption axis of the polarizer and the in-plane slow axis of the optically anisotropic layer (A1) was 76°. In addition, the in-plane slow axis direction on the surface of the optically anisotropic layer (B1) on the optically anisotropic layer (A1) side was 8°, with the width direction as a reference of 0°. In addition, the in-plane slow axis direction on the surface of the optically anisotropic layer (B1) on the optically anisotropic layer (C1) side was 95°, with the width direction as a reference of 0°.

The in-plane slow axis direction of the optically anisotropic layer is expressed as negative in a case where it is clockwise (right-handed turning) and positive in a case where it is counterclockwise (left-handed turning) with the width direction of the circularly polarizing plate as a reference of 0°, upon observing the circularly polarizing plate from the polarizer side.

In the circularly polarizing plate (P1), the in-plane slow axis of the optically anisotropic layer (A1) is rotated counterclockwise by 76°, and the twisted direction of the liquid crystal compound in the optically anisotropic layer (B1) is counterclockwise, with reference to the absorption axis of the polarizer, upon observing the circularly polarizing plate (P1) from the optically anisotropic layer side.

Whether the twisted direction of the liquid crystal compound is clockwise or counterclockwise is determined with reference to the in-plane slow axis on the surface of the optically anisotropic layer (B1) on the optically anisotropic layer (C1) side, upon observing the circularly polarizing plate (P1) from the optically anisotropic layer side.

Examples 2, 3, 5 to 10, and Comparative Example 2

A circularly polarizing plate was produced in the same manner as in Example 1, except that the type of the composition for forming an optically anisotropic layer was changed as shown in Table 3 which will be described later.

However, in Example 5, the average thickness of the optically anisotropic layer (A2) was 1.4 μm, and the in-plane retardation at a wavelength of 550 nm was 198 nm. In addition, in a case where the optically anisotropic layer (A2) was prepared instead of the optically anisotropic layer (A1) in the same manner as in Example 1, the rotation axis of a rubbing roller was changed from −14° to 76°. In addition, in Example 5, the average thickness of the optically anisotropic layer (B3) was 1.4 μm, And at a wavelength of 550 nm was 191 nm, and the twisted angle of the liquid crystal compound was 85°. In addition, in a case where the optically anisotropic layer (B3) was prepared instead of the optically anisotropic layer (B1) in the same manner as in Example 1, the in-plane slow axis direction (alignment axis angle of the liquid crystal compound) was −76° on the air side and 9° on the side in contact with the optically anisotropic layer (C1) in a case of viewing from the optically anisotropic layer (B3) side, assuming that the width direction of the film is defined as 0° (the longitudinal direction of the film is defined as 90°). The thickness of the optically anisotropic layer (C1) was changed from 0.7 μm to 0.4 μm. The relationship between the in-plane slow axes of individual optically anisotropic layers of the circularly polarizing plate obtained in Example 5 is as shown in FIG. 7 and FIG. 8.

In addition, in Comparative Example 2, the average thickness of the optically anisotropic layer (A1) was 1.2 μm, and the in-plane retardation at a wavelength of 550 nm was 184 nm. In addition, in Comparative Example 2, the average thickness of the optically anisotropic layer (B6) was 1.3 μm, And at a wavelength of 550 nm was 168 nm, and the twisted angle of the liquid crystal compound was 810. In addition, in a case where the optically anisotropic layer (B6) was prepared instead of the optically anisotropic layer (B1) in the same manner as in Example 1, the in-plane slow axis direction (alignment axis angle of the liquid crystal compound) was 14° on the air side and 95° on the side in contact with the optically anisotropic layer (C1) in a case of viewing from the optically anisotropic layer (B6) side, assuming that the width direction of the film is defined as 0° (the longitudinal direction of the film is defined as 90°).

The composition (A2) for forming an optically anisotropic layer used in Table 3 has the same composition as that of the composition (A1) for forming an optically anisotropic layer, except that the disk-like liquid crystal compound 1 (80 parts by mass) and the disk-like liquid crystal compound 2 (20 parts by mass) were changed to 20 parts by mass of the rod-like liquid crystal compound (A), 54 parts by mass of the rod-like liquid crystal compound (B), and 26 parts by mass of the rod-like liquid crystal compound (C).

The compositions (B2) to (B7) for forming an optically anisotropic layer used in Table 3 have the same composition as that of the composition (B1) for forming an optically anisotropic layer, except that the parts by mass of the rod-like liquid crystal compounds (A) to (C) were changed as shown in Table 1.

The "Reverse dispersion liquid crystal percentage" in Table 1 represents a mass percentage (%) of the reverse wavelength dispersion liquid crystal compound in the liquid crystal compound contained in each composition.

TABLE 1

| Composition for forming optically anisotropic layer | (B1) | (B2) | (B3) | (B4) | (B5) | (B6) | (B7) |
|---|---|---|---|---|---|---|---|
| Rod-like liquid crystal compound (A) (parts by mass) | 74 | 69 | 20 | 85 | 57 | 100 | 48 |
| Rod-like liquid crystal compound (B) (parts by mass) | 18 | 21 | 54 | 10 | 29 | 0 | 35 |

TABLE 1-continued

| Composition for forming optically anisotropic layer | (B1) | (B2) | (B3) | (B4) | (B5) | (B6) | (B7) |
|---|---|---|---|---|---|---|---|
| Rod-like liquid crystal compound (C) (parts by mass) | 8 | 10 | 26 | 5 | 14 | 0 | 17 |
| Reverse dispersion liquid crystal percentage | 26% | 31% | 80% | 15% | 43% | 0% | 52% |

The compositions (C2) and (C3) for forming an optically anisotropic layer used in Table 3 have the same composition as that of the composition (C1) for forming an optically anisotropic layer, except that the parts by mass of the rod-like liquid crystal compounds (A) to (C) were changed as shown in Table 2.

The "Reverse dispersion liquid crystal percentage" in Table 2 represents a mass percentage (%) of the reverse wavelength dispersion liquid crystal compound in the liquid crystal compound contained in each composition.

TABLE 2

| Composition for forming optically anisotropic layer | (C1) | (C2) | (C3) |
|---|---|---|---|
| Rod-like liquid crystal compound (A) (parts by mass) | 100 | 48 | 69 |
| Rod-like liquid crystal compound (B) (parts by mass) | 0 | 35 | 21 |
| Rod-like liquid crystal compound (C) (parts by mass) | 0 | 17 | 10 |
| Reverse dispersion liquid crystal percentage | 0% | 52% | 31% |

Example 4

An alignment film coating liquid 2 having the following composition was continuously applied onto the surface of an elongated cellulose acylate film prepared in the same manner as in Example 1 and subjected to the alkali saponification treatment with a #14 wire bar. The obtained coating film was dried with hot air at 60° C. for 60 seconds and further with hot air at 100° C. for 120 seconds to obtain an alignment film 2.

| Alignment film coating liquid 2 | |
|---|---|
| Polyvinyl alcohol given below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Chemical Co., Ltd.) | 0.175 parts by mass |

Polyvinyl alcohol (The numerical value in each repeating unit represents the content (% by mass) with respect to all the repeating units, the content of the repeating unit on the left side is 88% by mass, and the content of the repeating unit on the right side is 12% by mass.)

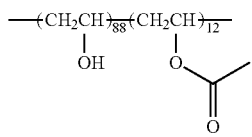

Formation of Optically Anisotropic Layer D1

A composition (D1) for forming an optically anisotropic layer containing a disk-like liquid crystal compound having the following composition was applied onto the alignment film 2 using a Geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (D1).

The average thickness of the optically anisotropic layer (D1) was 0.3 μm. In addition, the in-plane retardation at a wavelength of 550 nm was 0 nm, and the thickness direction retardation at a wavelength of 550 nm was 40 nm. It was confirmed that the average tilt angle of the disc plane of the disk-like liquid crystal compound with respect to the film surface was 0°, and the disk-like liquid crystal compound was horizontally aligned with respect to the film surface.

| Composition (D1) for forming optically anisotropic layer | |
|---|---|
| Disk-like liquid crystal compound 1 given above | 80 parts by mass |
| Disk-like liquid crystal compound 2 given above | 20 parts by mass |
| Fluorine-containing compound C given above | 0.21 parts by mass |
| Polymer (A) given below | 0.50 parts by mass |
| Ethylene oxide-modified trimethylolpropane triacrylate (V # 360, manufactured by Osaka Organic Chemical Industry Ltd.) | 10 parts by mass |
| Photopolymerization initiator (Irgacure 907, manufactured by BASF SE) | 3.0 parts by mass |
| Methyl ethyl ketone | 200 parts by mass |

Polymer (A) (In the formula, the numerical value described in each repeating unit represents the content (% by mass) of each repeating unit with respect to all the repeating units).

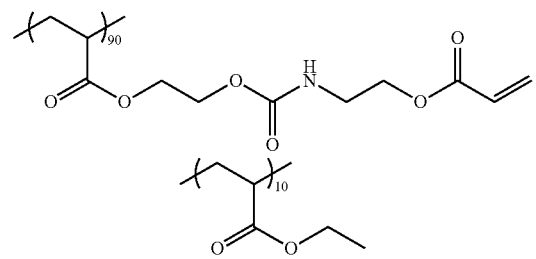

Formation of Laminate (D1-A1)

The optically anisotropic layer (D1) prepared above was continuously subjected to a rubbing treatment. At this time, the longitudinal direction and the transport direction of the elongated film were parallel, and the angle between the film longitudinal direction (transport direction) and the rubbing roller rotation axis was 76°. In a case where the film longitudinal direction (transport direction) is 90° and the clockwise direction is represented by a positive value with reference to a film width direction as a reference (0°) in a case of being observed from the film side, the rotation axis of the rubbing roller is at −14°. In other words, the position of the rotation axis of the rubbing roller is a position rotated by 76° clockwise with reference to the longitudinal direction of the film.

The composition (A1) for forming an optically anisotropic layer was applied onto the optically anisotropic layer (D1) subjected to a rubbing treatment using a Geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (A1).

The average thickness of the optically anisotropic layer (A1) was 1.1 μm. The retardation at a wavelength of 550 nm was 160 nm. It was confirmed that the average tilt angle of the disc plane of the disk-like liquid crystal compound with respect to the film surface was 90°, and the disk-like liquid crystal compound was aligned perpendicular to the film surface.

In addition, assuming that the angle of the in-plane slow axis of the optically anisotropic layer (A1) is parallel to the rotation axis of the rubbing roller, and the width direction of the film is 0° (the counterclockwise direction is 90° and the clockwise direction is −90° in a longitudinal direction), the in-plane slow axis direction of the optically anisotropic layer (A1) was −14° in a case of viewing from the optically anisotropic layer (A1) side.

A laminate (D1-A1) in which the optically anisotropic layer (D1) and the optically anisotropic layer (A1) were laminated on a cellulose acylate film was prepared by the above procedure.

Formation of Laminate (B2-C1)

Next, in the same manner as in Example 1, a composition (B2) for forming an optically anisotropic layer containing a rod-like liquid crystal compound having the following composition was applied onto the optically anisotropic layer (C1) prepared above by using a Geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (B2).

The optically anisotropic layer (B2) had an average thickness of 1.3 μm, And of 170 nm at a wavelength of 550 nm, and a twisted angle of a liquid crystal compound of 86°. Assuming that the width direction of the film is defined as 0° (the longitudinal direction of the film is defined as 90°), the in-plane slow axis direction (alignment axis angle of the liquid crystal compound) was 9° on the air side and 95° on the side in contact with the optically anisotropic layer (C1), in a case of viewing from the optically anisotropic layer (B2) side.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observing the substrate from the surface side of the optically anisotropic layer.

A laminate (B2-C1) in which the optically anisotropic layer (C1) and the optically anisotropic layer (B2) were directly laminated on an elongated cellulose acylate film was prepared by the above procedure.

Preparation of Optical Film (C1-B2-A1-D1)

The surface side of the laminate (D1-A1) formed on the above prepared elongated cellulose acylate film, and the surface side of the optically anisotropic layer (B2) of the laminate (B2-C1) formed on the above prepared elongated cellulose acylate film were continuously bonded to each other using an ultraviolet curable adhesive such that the longitudinal direction of the film of the laminate (D1-A1) and the longitudinal direction of the film of the laminate (B2-C1) were parallel to each other.

Subsequently, the cellulose acylate film on the laminate (D1-A1) side was peeled off to expose the surface of the optically anisotropic layer (D1) in contact with the cellulose acylate film. In this manner, an optical film (C1-B2-A1-D1) in which the optically anisotropic layer (C1), the optically anisotropic layer (B2), the optically anisotropic layer (A1), and the optically anisotropic layer (D1) were laminated in this order on an elongated cellulose acylate film was obtained.

Preparation of Circularly Polarizing Plate

The surface of the optically anisotropic layer (D1) of the above prepared elongated optical film (C1-B2-A1-D1) and the surface of the polarizer (the surface opposite to the polarizer protective film) of the elongated linearly polarizing plate prepared in Example 1 were continuously bonded to each other using an ultraviolet curable adhesive. Subsequently, the cellulose acylate film on the optically anisotropic layer (C1) side was peeled off to expose the surface of the optically anisotropic layer (C1) in contact with the cellulose acylate film.

In this manner, a circularly polarizing plate (P4) consisting of the optical film (D1-A1-B2-C1) and the linearly polarizing plate was prepared. At this time, the polarizer protective film, the polarizer, the optically anisotropic layer (D1), the optically anisotropic layer (A1), the optically anisotropic layer (B2), and the optically anisotropic layer (C1) were laminated in this order, and the angle formed by the absorption axis of the polarizer and the in-plane slow axis of the optically anisotropic layer (A1) was 76°. In addition, the in-plane slow axis direction on the surface of the optically anisotropic layer (B2) on the optically anisotropic layer (A1) side was 9°, with the width direction as a reference of 0°. In addition, the in-plane slow axis direction on the surface of the optically anisotropic layer (B2) on the optically anisotropic layer (C1) side was 95°, with the width direction as a reference of 0°.

The in-plane slow axis direction of the optically anisotropic layer is expressed as negative in a case where it is clockwise (right-handed turning) and positive in a case where it is counterclockwise (left-handed turning) with the width direction of the substrate as a reference of 0°, upon observing the substrate from the surface side of the optically anisotropic layer.

Comparative Example 1

An optically anisotropic layer (C1) was formed on an elongated cellulose acylate film in the same manner as in Example 1.

Next, an optically anisotropic layer (1h) was formed on the optically anisotropic layer (C1) prepared above, using the composition A-1 described in Example 9 of WO2018/216812A and using a reverse wavelength dispersion liquid crystal compound. The in-plane retardation at a wavelength of 550 nm was 142 nm. It was confirmed that the average tilt angle of the major axis direction of the reverse wavelength dispersion liquid crystal compound with respect to the film surface was 0°, and the reverse wavelength dispersion liquid crystal compound was aligned horizontally with respect to the film surface. In addition, assuming that the width direction of the film is defined as 0° (the longitudinal direction of the film is defined as 90°), the slow axis was 45° in a case of viewing from the optically anisotropic layer (1h) side.

In this manner, a laminate in which the optically anisotropic layer (C1) containing a vertically aligned rod-like liquid crystal compound and the optically anisotropic layer (1h) formed by fixing a horizontally aligned reverse wavelength dispersion liquid crystal compound were directly laminated was prepared.

Preparation of Organic EL Display Device

Mounting on Display Device

The SAMSUNG GALAXY S4 equipped with an organic EL panel was disassembled, a circularly polarizing plate was peeled off, and each of the circularly polarizing plates prepared in the foregoing Examples 1 to 10 and Comparative Examples 1 and 2 was bonded to the display device using a pressure sensitive adhesive such that the polarizer protective film was arranged on the outside.

Evaluation of Display Performance

Front Direction

The prepared organic EL display device was displayed in black and observed from the front under bright light, and the shift in tint was evaluated according to the following standards. The results are shown in Table 3 which will be given later.

A: The shift in tint is not visible at all, or the shift in tint is visible, but only a little. (acceptable)

B: The shift in tint is visible, but the reflected light is small and there is no problem in use. (acceptable)

Oblique Direction

The prepared organic EL display device was displayed in black, a fluorescent lamp is projected from a polar angle of 55° under bright light, and the reflected light was observed from all directions. The azimuthal angle dependence of the shift in tint was evaluated according to the following standards. The results are shown in Table 3.

A: The shift in tint is not visible at all.

B: Although the shift in tint is visible, it is very slight. (acceptable)

C: The shift in tint is slightly visible, but the reflected light is small and there is no problem in use. (acceptable)

D: The shift in tint is visible and there is a lot of reflected light, which is unacceptable.

In Table 3, the column of "Optically anisotropic layer" represents types of optically anisotropic layers contained in the optical film of each of Examples and Comparative Examples. For example, "A1" represents an optically anisotropic layer (A1).

In the column of "Liquid crystal compound type" in Table 3, "Disk-like" represents "a disk-like liquid crystal compound" and "Rod-like" represents "a rod-like liquid crystal compound".

In Table 3, the column of "Reverse dispersion liquid crystal contained" indicates "Contained" in a case where the liquid crystal compound used for forming each optically anisotropic layer contains a reverse wavelength dispersion liquid crystal compound.

In Table 3, the column of "Ratio" represents a ratio of an in-plane retardation of an optically anisotropic layer at a wavelength of 450 nm to the in-plane retardation of the optically anisotropic layer at a wavelength of 550 nm in a case of the optically anisotropic layers (A1) and (A2); a ratio of a refractive index anisotropy Δn of an optically anisotropic layer at a wavelength of 450 nm to the refractive index anisotropy Δn of the optically anisotropic layer at a wavelength of 550 nm in a case of the optically anisotropic layers (B1) to (B7); and a ratio of a thickness direction retardation of an optically anisotropic layer at a wavelength of 450 nm to the thickness direction retardation of the optically anisotropic layer at a wavelength of 550 nm in a case of the optically anisotropic layers (C1) to (C3).

TABLE 3

| | Optically anisotropic layer | Liquid crystal compound type | Reverse dispersion liquid crystal contained | Ratio | Evaluation of organic EL display performance | |
|---|---|---|---|---|---|---|
| | | | | | Front direction | Oblique direction |
| Example 1 | A1 | Disk-like | | 1.09 | A | A |
| | B1 | Rod-like | Contained | 1.07 | | |
| | C1 | Rod-like | | 1.10 | | |
| Example 2 | A1 | Disk-like | | 1.09 | A | A |
| | B2 | Rod-like | Contained | 1.05 | | |
| | C1 | Rod-like | | 1.10 | | |
| Example 3 | A1 | Disk-like | | 1.09 | A | A |
| | B2 | Rod-like | Contained | 1.05 | | |
| | C2 | Rod-like | Contained | 1.00 | | |
| Example 4 | D1 | Disk-like | | 1.09 | A | A |
| | A1 | Disk-like | | 1.09 | | |
| | B2 | Rod-like | Contained | 1.05 | | |
| | C1 | Rod-like | | 1.10 | | |
| Example 5 | A2 | Rod-like | Contained | 0.86 | A | A |
| | B3 | Rod-like | Contained | 0.86 | | |
| | C1 | Rod-like | | 1.10 | | |
| Example 6 | A1 | Disk-like | | 1.09 | A | B |
| | B4 | Rod-like | Contained | 1.09 | | |
| | C1 | Rod-like | | 1.10 | | |
| Example 7 | A1 | Disk-like | | 1.09 | A | B |
| | B5 | Rod-like | Contained | 1.03 | | |
| | C1 | Rod-like | | 1.10 | | |
| Example 8 | A1 | Disk-like | | 1.09 | A | B |
| | B4 | Rod-like | Contained | 1.09 | | |
| | C3 | Rod-like | Contained | 1.05 | | |
| Example 9 | A1 | Disk-like | | 1.09 | A | C |
| | B6 | Rod-like | | 1.10 | | |
| | C3 | Rod-like | Contained | 1.05 | | |
| Example 10 | A1 | Disk-like | | 1.09 | A | C |
| | B7 | Rod-like | Contained | 1.00 | | |
| | C1 | Rod-like | | 1.10 | | |
| Comparative Example 1 | 1h | Rod-like | Contained | 0.82 | B | D |
| | C1 | Rod-like | | 1.10 | | |
| Comparative Example 2 | A1 | Disk-like | | 1.09 | A | D |
| | B6 | Rod-like | | 1.10 | | |
| | C1 | Rod-like | | 1.10 | | |

As shown in Table 1, it was confirmed that the optical film according to embodiment of the present invention exhibited a desired effect.

Above all, from the comparison of Examples 1 to 3 and 6 to 10, it was confirmed that the effect was more excellent in a case where the ratio of the refractive index anisotropy Δn of the second optically anisotropic layer at a wavelength of 450 nm to the refractive index anisotropy Δn of the second optically anisotropic layer at a wavelength of 550 nm was 1.02 to 1.09 (preferably 1.04 to 1.07).

EXPLANATION OF REFERENCES 10A, 10B: optical film
12A, 12B: first optically anisotropic layer
14: second optically anisotropic layer
16: third optically anisotropic layer
20: polarizer
100A, 100B: circularly polarizing plate

What is claimed is:

1. An optical film comprising:
a first optically anisotropic layer;
a second optically anisotropic layer; and
a third optically anisotropic layer in this order, wherein the first optically anisotropic layer is a layer formed by fixing a vertically aligned disk-like liquid crystal compound or a layer formed by fixing a horizontally aligned rod-like liquid crystal compound, the second optically anisotropic layer is a layer formed by fixing a rod-like liquid crystal compound twist-aligned along a helical axis extending in a thickness direction, the third optically anisotropic layer is a layer formed by fixing a vertically aligned rod-like liquid crystal compound, and at least one of the first optically anisotropic layer, the second optically anisotropic layer, or the third optically anisotropic layer is a layer formed of a liquid crystal compound containing a reverse wavelength dispersion liquid crystal compound.

2. The optical film according to claim 1,
wherein a ratio of a refractive index anisotropy Δn of the second optically anisotropic layer at a wavelength of 450 nm to a refractive index anisotropy Δn of the second optically anisotropic layer at a wavelength of 550 nm is 1.02 to 1.09.

3. The optical film according to claim 1,
wherein the first optically anisotropic layer is the layer formed by fixing a vertically aligned disk-like liquid crystal compound, and
a ratio of an in-plane retardation of the first optically anisotropic layer at a wavelength of 450 nm to an in-plane retardation of the first optically anisotropic layer at a wavelength of 550 nm is 1.08 to 1.25.

4. The optical film according to claim 1,
wherein a ratio of a thickness direction retardation of the third optically anisotropic layer at a wavelength of 450 nm to a thickness direction retardation of the third optically anisotropic layer at a wavelength of 550 nm is 0.82 to 1.12.

5. The optical film according to claim 4,
wherein a total thickness of the optically anisotropic layers contained in the optical film is 10 μm.

6. A circularly polarizing plate comprising:
the optical film according to claim 1; and
a polarizer,
wherein the first optically anisotropic layer is disposed closer to the polarizer than the second optically anisotropic layer and the third optically anisotropic layer.

7. The circularly polarizing plate according to claim 6,
wherein a luminosity corrected single transmittance of the polarizer is 42% or more.

8. A display device comprising:
the optical film according to claim 1.

9. The optical film according to claim 2,
wherein the first optically anisotropic layer is the layer formed by fixing a vertically aligned disk-like liquid crystal compound, and
a ratio of an in-plane retardation of the first optically anisotropic layer at a wavelength of 450 nm to an in-plane retardation of the first optically anisotropic layer at a wavelength of 550 nm is 1.08 to 1.25.

10. The optical film according to claim 2,
wherein a ratio of a thickness direction retardation of the third optically anisotropic layer at a wavelength of 450 nm to a thickness direction retardation of the third optically anisotropic layer at a wavelength of 550 nm is 0.82 to 1.12.

11. The optical film according to claim 3,
wherein a ratio of a thickness direction retardation of the third optically anisotropic layer at a wavelength of 450 nm to a thickness direction retardation of the third optically anisotropic layer at a wavelength of 550 nm is 0.82 to 1.12.

* * * * *